United States Patent
Yura et al.

(10) Patent No.: US 8,212,455 B2
(45) Date of Patent: Jul. 3, 2012

(54) PIEZOELECTRIC/ELECTROSTRICTIVE FILM ELEMENT AND METHOD MANUFACTURING THE SAME

(75) Inventors: Yukinobu Yura, Nagoya (JP); Shohei Yokoyama, Nagoya (JP); Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 12/358,559

(22) Filed: Jan. 23, 2009

(65) Prior Publication Data
US 2009/0189489 A1    Jul. 30, 2009

(30) Foreign Application Priority Data

| Jan. 30, 2008 | (JP) | 2008-019717 |
| Mar. 21, 2008 | (JP) | 2008-074427 |
| Jun. 10, 2008 | (JP) | 2008-152099 |
| Jun. 10, 2008 | (JP) | 2008-152100 |
| Nov. 27, 2008 | (JP) | 2008-303236 |

(51) Int. Cl.
*H01L 41/08* (2006.01)
(52) U.S. Cl. ............ 310/358; 252/62.9 PZ; 252/62.9 R
(58) Field of Classification Search .................. 310/358, 310/359, 328, 311, 357; 257/347; 252/62.9 PZ, 252/62.9 R; *H01L 41/187*
See application file for complete search history.

(56) References Cited

U.S. PATENT DOCUMENTS

| 5,032,559 A | 7/1991 | McSweeney et al. |
| 5,126,615 A | 6/1992 | Takeuchi et al. |
| 6,004,474 A | 12/1999 | Takenaka et al. |
| 6,097,133 A | 8/2000 | Shimada et al. |
| 6,511,763 B1 | 1/2003 | Kida et al. |
| 6,639,340 B1 | 10/2003 | Qiu et al. |
| 7,381,671 B2 | 6/2008 | Ogiso |
| 7,414,352 B2 | 8/2008 | Nanataki et al. |
| 7,417,361 B2 | 8/2008 | Nanataki et al. |
| 7,514,848 B2 | 4/2009 | Kobane et al. |
| 7,544,244 B2 | 6/2009 | Sakashita et al. |
| 7,545,084 B2 * | 6/2009 | Nanataki et al. ............... 310/358 |
| 7,686,974 B2 | 3/2010 | Priya |
| 2002/0193237 A1 * | 12/2002 | Messing et al. ............... 501/136 |
| 2007/0203014 A1 | 8/2007 | Watanabe |
| 2007/0228318 A1 | 10/2007 | Yuuya |

(Continued)

FOREIGN PATENT DOCUMENTS

EP    0 455 342 A1    11/1991

(Continued)

OTHER PUBLICATIONS

European Search Report mailed Apr. 3, 2012.

(Continued)

*Primary Examiner* — Thomas Dougherty
*Assistant Examiner* — Karen B Addison
(74) *Attorney, Agent, or Firm* — Burr & Brown

(57) ABSTRACT

An actuator includes a fired ceramic substrate having a space opened downward, a first electrode formed on the upper surface of the fired ceramic substrate above the space, a piezoelectric/electrostrictive body formed on the first electrode so that the volume changes with input and output of electric power, and a second electrode formed on the piezoelectric/electrostrictive body. The piezoelectric/electrostrictive body is composed of $Pb(Zr_{1-x}Ti_x)O_3$ or $(Li, Na, K)(Nb, Ta)O_3$ as a main component and contains crystals oriented along the direction of an electric field. In the actuator, the degree of orientation of the piezoelectric/electrostrictive body can be increased regardless of the orientation of the substrate on which the piezoelectric/electrostrictive body is formed.

19 Claims, 7 Drawing Sheets

U.S. PATENT DOCUMENTS

| | | |
|---|---|---|
| 2008/0018207 A1 | 1/2008 | Nanataki et al. |
| 2009/0072673 A1 | 3/2009 | Fujii et al. |
| 2009/0239041 A1 | 9/2009 | Yura et al. |
| 2010/0019624 A1 | 1/2010 | Kaigawa et al. |

FOREIGN PATENT DOCUMENTS

| | | |
|---|---|---|
| EP | 1 333 507 A2 | 8/2003 |
| EP | 1 489 668 A2 | 12/2004 |
| EP | 1 675 191 | 6/2006 |
| EP | 1 675 192 | 6/2006 |
| EP | 1975137 A1 * | 1/2008 |
| JP | 2001-181041 A1 | 7/2001 |
| JP | 2005-183701 A1 | 7/2005 |
| JP | 2006-185940 A1 | 7/2006 |
| JP | 2006-185950 A1 | 7/2006 |
| JP | 2007-223863 A1 | 9/2007 |

OTHER PUBLICATIONS

Extended European Search Report dated Apr. 24, 2012.

* cited by examiner

PIEZOELECTRIC/ELECTROSTRICTIVE FILM ELEMENT AND METHOD MANUFACTURING THE SAME

BACKGROUND OF THE INVENTION

1. Field of the Invention

The present invention relates to a piezoelectric/electrostrictive film element and a method for manufacturing the same. More specifically, the present invention relates to a piezoelectric/electrostrictive film element formed on a fired ceramic substrate and a method for manufacturing the same.

2. Description of the Related Art

There has been proposed a piezoelectric/electrostrictive film element which is formed on a fired ceramic substrate of zirconium oxide and has excellent piezoelectric characteristics and excellent electrostrictive characteristics. In the piezoelectric/electrostrictive film element, the ratio of the number of crystal grains having a larger diameter in the width direction than that in the thickness direction is 70% or more of the many crystal grains mainly composed of, for example, $Pb(Zr,Ti)O_3$ and observed in a section in any desired thickness direction (refer to, for example, Japanese Unexamined Patent Application Publication No. 2006-185940). There has been also proposed a piezoelectric/electrostrictive film element which has excellent piezoelectric characteristics and electrostrictive characteristics and exhibits sufficient durability even when flexural displacement is repeated many times. In this piezoelectric/electrostrictive film element, the ratio of the number of crystal grains partially exposed to at least one interface with the outside in the thickness direction is 80% or more of the many crystal grains observed in a section in any desired thickness direction, and the ratio of the number of crystal grains partially exposed to both interfaces with the outside in the thickness direction is 50% or more (refer to, for example, Japanese Unexamined Patent Application Publication No. 2006-185950). There has been further proposed a piezoelectric element with good characteristics which is formed by integrally firing a structure including a piezoelectric ceramic material layer and electrode material layers disposed on both surfaces of the piezoelectric ceramic material layer, and which includes an element body having a structure including a piezoelectric ceramic material layer and electrode material layers disposed on both surfaces of the piezoelectric ceramic material layer. In the piezoelectric element, the piezoelectric ceramic layer is mainly composed of a piezoelectric ceramic having a perovskite structure, the average crystal grain diameter of the piezoelectric ceramic observed in the lamination direction is larger than the thickness of a piezoelectric ceramic layer, and the directions of crystal grains are oriented (refer to, for example, Japanese Unexamined Patent Application Publication No. 2005-183701).

SUMMARY OF THE INVENTION

As described above, in the piezoelectric/electrostrictive film element including a piezoelectric/electrostrictive body formed on zirconium oxide described in Japanese Unexamined Patent Application Publication No. 2006-185940 and, and the piezoelectric/electrostrictive film element described in Japanese Unexamined Patent Application Publication No. 2006-185950, the piezoelectric characteristics and the electrostrictive characteristics can be enhanced by making the particle aspect ratios uniform in a predetermined direction. However, the piezoelectric characteristics and the electrostrictive characteristics have not yet been sufficiently enhanced and have been desired to be further improved. In addition, in the piezoelectric ceramic layer described in Japanese Unexamined Patent Application Publication No. 2005-183701, when the piezoelectric ceramic layer is formed on a fired ceramic substrate, a glass component substantially required for achieving a high degree of orientation may diffuse into the substrate. Further, there has been the problem of degrading the piezoelectric characteristics due to the glass component.

The present invention has been achieved in consideration of the above-mentioned problems and an object of the present invention is to provide a piezoelectric/electrostrictive film element formed on a fired ceramic substrate and having enhanced piezoelectric/electrostrictive characteristics.

As a result of intensive research for achieving the object, the inventors of the present invention have found that in a piezoelectric/electrostrictive element formed on a fired ceramic substrate, when a plurality of crystals contained are oriented without containing a glass component in a state in which specific crystal planes are aligned, piezoelectric/electrostrictive characteristics can be enhanced, resulting in the achievement of the present invention.

The present invention provides a piezoelectric/electrostrictive film element including a fired ceramic substrate, an electrode, and a piezoelectric/electrostrictive body formed on the fired ceramic substrate directly or indirectly through the electrode and oriented in a specific direction without containing a glass component.

The present invention also provides a method for manufacturing a piezoelectric/electrostrictive film element including a fired ceramic substrate and an electrode, the method comprising: a piezoelectric/electrostrictive body forming step including: a raw material forming step of forming a piezoelectric/electrostrictive body raw material containing crystal grains and not containing a glass component on the fired ceramic substrate directly or indirectly through the electrode; and a firing step of firing the raw material at a predetermined temperature to form a crystal.

The present invention also provides a method for manufacturing a piezoelectric/electrostrictive film element including a fired ceramic substrate and an electrode, the method comprising: a first crystal forming step including a raw material forming step of forming a piezoelectric/electrostrictive body raw material not containing a glass component on the fired ceramic substrate directly or indirectly through the electrode, and a firing step of firing the raw material at a predetermined temperature to form a crystal; and a piezoelectric/electrostrictive body forming step of performing at least a one time raw material forming step of forming a piezoelectric/electrostrictive body raw material that does not contain a glass component on the resulting crystal, and a firing step of firing the raw material at a predetermined temperature to form a crystal.

With the piezoelectric/electrostrictive film element and the manufacturing method of the invention, the piezoelectric/electrostrictive characteristics can be enhanced. Although the reason why such an effect can be obtained is not known, it is supposed that for example, when crystals are not oriented, some of the crystals cannot sufficiently exhibit the piezoelectric effect and the electrostrictive effect depending on the crystal direction to cause a low-efficiency state, while when a plurality of crystals are oriented with specific crystal planes aligned, a crystal body containing a plurality of crystals can sufficiently exhibit the function. Also, it is supposed that, since the crystal body is oriented without containing the glass component, an oriented film can be obtained without the diffusion of the glass component into the fired ceramic substrate, thereby suppressing deterioration of the piezoelectric characteristics. Here, the term "glass component" represents, for example, lead-borate glass, zinc-borate glass, borosilicate glass, lead-silicate glass, zinc-silicate glass, and bismuth-silicate glass. In addition, a raw material forming step of forming a raw material may be an application step of applying a raw material.

BRIEF DESCRIPTION OF THE DRAWINGS

FIG. 1 is a drawing illustrating an example of an actuator including a piezoelectric/electrostrictive film element according to an embodiment of the present invention, in which

FIG. 2 is a drawing showing an example of a method for manufacturing a piezoelectric/electrostrictive element, in which

FIG. 4 is a drawing showing an example of a method for manufacturing a piezoelectric/electrostrictive element, in which

DETAILED DESCRIPTION OF THE INVENTION

Figure 1A:
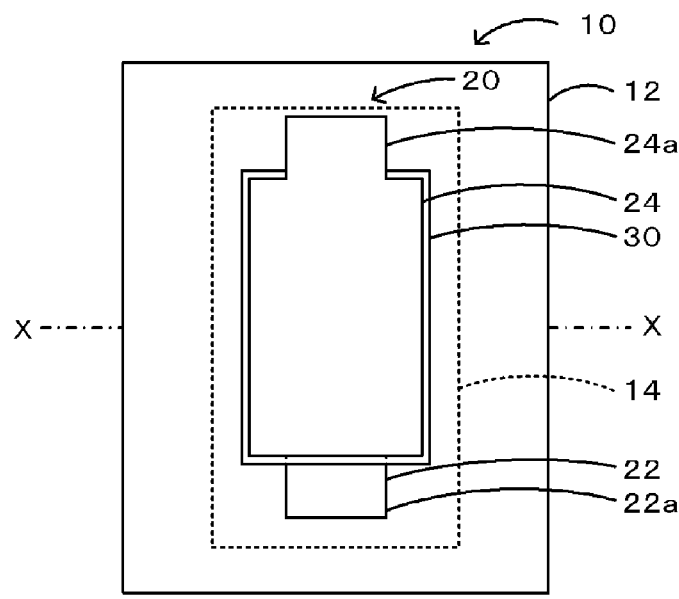
FIG. 1A is a plan view.
Figure 1B:
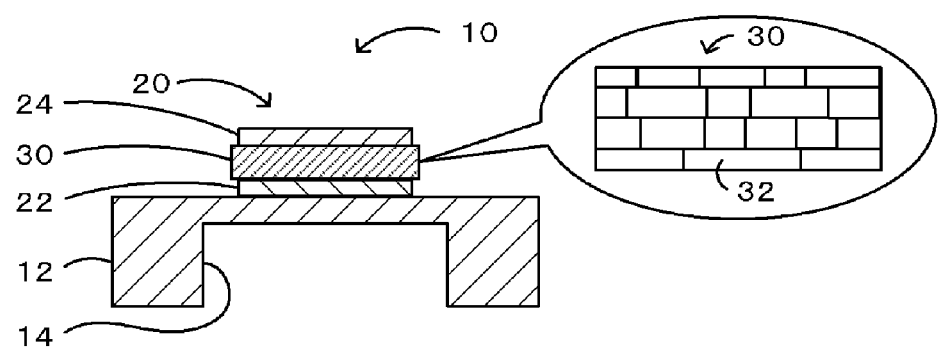
FIG. 1B is a sectional view taken along line X-X in FIG. 1A.

A piezoelectric/electrostrictive film element of the present invention is described with reference to the drawings. FIG. 1 is a drawing illustrating an example of an actuator 10 including a piezoelectric/electrostrictive film element 20 according to an embodiment of the present invention, in which FIG. 1A is a plan view, and FIG. 1B is a sectional view taken along line X-X in FIG. 1A. The actuator 10 of this embodiment includes a fired ceramic substrate 12 having a space 14 opened downward, a first electrode 22 formed on the upper surface of the fired ceramic substrate 12 above the space 14, a piezoelectric/electrostrictive body 30 formed on the first electrode 22 so that the volume changes with input and output of electric power, and a second electrode 24 formed on the piezoelectric/electrostrictive body 30. In the actuator 10, the piezoelectric/electrostrictive body 30 is driven by applying a voltage to apply pressure to a fluid (e.g., a liquid) contained in the space 14 of the fired ceramic substrate 12.

The fired ceramic substrate 12 is preferably composed of an unoriented polycrystalline base material which is a material composed of a plurality of unoriented crystals. The unoriented polycrystalline base material is preferably composed of a ceramic containing at least one material selected from the group consisting of stabilized zirconium oxide, aluminum oxide, magnesium oxide, mullite, aluminum nitride, and silicon nitride. In particular, stabilized zirconium oxide is more preferred because of high mechanical strength and excellent toughness. In the present invention, the term "stabilized zirconium oxide" represents zirconium oxide to which a stabilizer is added to suppress crystal phase transition, and also includes partially stabilized zirconium oxide. An example of the stabilized zirconium oxide contains 1 to 30 mol % of a stabilizer such as calcium oxide, magnesium oxide, yttrium oxide, scandium oxide, ytterbium oxide, cerium oxide, rare-earth metal oxide, or the like. In particular, yttrium oxide is preferably added as the stabilizer from the viewpoint of increasing the mechanical strength of a vibrating portion. In this case, yttrium oxide is preferably added in an amount of 1.5 to 6 mol % and more preferably 2 to 4 mol %. Also, 0.1 to 5 mol % of aluminum oxide is preferably added. The crystal phase of stabilized zirconium oxide may be a cubic-monoclinic mixed phase, a tetragonal-monoclinic mixed phase, or a cubic-tetragonal-monoclinic mixed phase, but the main crystal phase is preferably a tetragonal phase or a tetragonal-cubic mixed phase from the viewpoint of strength, toughness, and durability.

The first electrode 22 includes a rectangular member having a rectangular tab 22a provided at an end and connected to the outside. As a material of the first electrode 22, at least one metal selected from the group consisting of platinum, palladium, ruthenium, gold, silver, and alloys thereof can be used. Among these metals, platinum or an alloy composed of platinum as a main component is preferred from the viewpoint of high heat resistance during firing. The first electrode 22 is preferably composed of an unoriented polycrystalline metal from the viewpoint of adhesion between the electrode and the piezoelectric/electrostrictive body 30 and adhesion between the electrode and the substrate. The second electrode 24 is formed similarly to the first electrode 22 except that a tab 24a is formed on the side opposite to the tab 22a.

The first electrode 22 can be formed in a sandwich structure, a comb structure, a tiger-skin structure, or the like. When the piezoelectric/electrostrictive body 30 is oriented so that a polarization axis is included in a plane parallel to the fired ceramic substrate 12, a tiger-skin structure or a comb structure is preferred because the direction of an electric field is in a plane parallel to the fired ceramic substrate 12. In this case, higher piezoelectric/electrostrictive characteristics can be obtained as compared with the case of an unoriented piezoelectric/electrostrictive body. On the other hand, when a polarization axis is oriented in a direction perpendicular to the fired ceramic substrate 12, a sandwich structure as shown in FIG. 1 is more preferred because the direction of an electric field coincides with the direction of the polarization axis. The term "polarization axis" represents a direction in which spontaneous polarization occurs due to ion displacement and high piezoelectric characteristics are exhibited. For example, the polarization axis of a perovskite compound is in a c-axis direction, and the polarization axis of a layered compound such as $Bi_4Ti_3O_{12}$ is in an in-plane direction. The second electrode 24 is the same as the first electrode 22.

The piezoelectric/electrostrictive body 30 has a rectangular external shape and is disposed in a state of being sandwiched between the first electrode 22 and the second electrode 24 on the fired ceramic substrate 12 indirectly through the first electrode 22. The piezoelectric/electrostrictive body 30 is formed as a ceramic film having a thickness of 1 μm to 20 μm (in this case, 5 μm) and contains a plurality of oriented crystals 32 having specific crystal planes oriented in a specific direction. The term "ceramic film" does not simply represents a film crystallized by heat treatment, but it represents a film crystallized by heat treatment and further subjected to crystal grain growth. The piezoelectric/electrostrictive body 30 may be formed in a single layer or multiple layers. Whether the piezoelectric/electrostrictive body 30 is layered can be recognized by observation of a section. When the piezoelectric/electrostrictive body 30 is formed in a layer, it may be regarded as containing substantially one oriented crystal 32 in the thickness direction. The expression "substantially one oriented crystal 32 in the thickness direction" represents that even when the oriented crystals 32 partially overlap in a portion, only one oriented crystal 32 is contained in the thickness direction without overlapping in the other larger portions. The meaning does not include a case in which two or more oriented crystals 32 overlap each other in most part of a ceramic film, such as a central portion thereof, and one oriented crystal 32 is present only at the ends in the thickness direction. Since the piezoelectric/electrostrictive body 30 may contain an oriented crystal 32 not grown to the thickness of the film during grain growth and an oriented crystal 32 with a crystal plane oriented in a different direction, there are locally present overlapping of oriented crystals 32 and an oriented crystal 32 with a crystal plane oriented in a different direction. However, in general, the piezoelectric/electrostrictive body 30 contains only one oriented crystal 32 in the thickness direction. In the piezoelectric/electrostrictive body 30, the area ratio of a portion containing only one oriented crystal gain in the thickness direction is preferably 70% or more, more preferably 80% or more, and most preferably 90% or more.

In the piezoelectric/electrostrictive body 30, a specific crystal axis is oriented in a specific direction along an electric field direction, i.e., a direction perpendicular to the electrode surfaces of the first electrode 22 and the second electrode 24. Namely, a specific crystal plane is preferably oriented in parallel to the electrode surfaces. In the piezoelectric/electrostrictive body 30, the degree of orientation of the specific crystal plane is preferably 25% or more, more preferably 30% or more, still more preferably 50% or more, and most preferably 80% or more according to a Lotgering method. When the degree of orientation is 25% or more, higher piezoelectric/electrostrictive characteristics can be achieved. The specific crystal plane may be a pseudocubic (100) plane in a plane of the piezoelectric/electrostrictive body. That is, when the piezoelectric/electrostrictive body 30 has a perovskite structure, a pseudocubic (100) axis is preferably oriented along the electric field direction. The pseudocubic (100) represents that, although an isotropic perovskite oxide may have a structure such as a tetragonal structure, a rhombic structure, a trigonal structure, or the like which is slightly distorted from a cubic structure, it is regarded as a cubic crystal and indicated by Miller indices because of small distortion. The degree of orientation according to the Lotgering method is determined by measuring an XRD diffraction pattern of an oriented plane of the piezoelectric/electrostrictive body 30 and calculating by the equation (1) below. In the equation (1), $\Sigma I(hkl)$ represents a total X-ray diffraction intensity of all crystal planes (hkl) measured in the piezoelectric/electrostrictive body 30, $\Sigma I_0(hkl)$ represents a total X-ray diffraction intensity of all crystal planes (hkl) measured in an unoriented material having the same composition as the piezoelectric/electrostrictive body 30, $\Sigma' I(HKL)$ represents a total X-ray diffraction intensity of crystallographically equivalent specific crystal planes (for example, (100) plane) measured in the piezoelectric/electrostrictive body 30, and $\Sigma' I_0(HKL)$ represents a total X-ray diffraction intensity of specific crystal planes measured in an unoriented material having the same composition as the piezoelectric/electrostrictive body 30.

$$\text{Degree of orientation} = \frac{\frac{\Sigma' I(HKL)}{\Sigma I(hkl)} - \frac{\Sigma' I_0(HKL)}{\Sigma I_0(hkl)}}{1 - \frac{\Sigma' I_0(HKL)}{\Sigma I_0(hkl)}} \times 100\% \qquad \text{Equation (1)}$$

In the piezoelectric/electrostrictive body 30, crystal grains may be composed of inorganic particles which grow to isotropic and polyhedral crystal grains or inorganic particles which grow to anisotropic crystal grains, for example, a layered compound $Bi_4Ti_3O_{12}$ or $SrBi_2Ta_2O_9$. However, the crystal grains are preferably composed of inorganic particles which grow to isotropic and polyhedral crystal grains. The expression "grow to isotropic and polyhedral crystal grains" will be described in detail below, but it is considered that a specific crystal plane can be grown according to conditions. The term "isotropic and polyhedral" represents, for example, a cubic shape. The "anisotropic" represents a plate shape, a strip shape, a columnar shape, a needle shape, a scale shape, or the like, which has a high ratio (aspect ratio) between long axis length and short axis length (for example, an aspect ratio of 2 or more). Such a grain shape results from a large difference in crystal growth rate between directions and a large difference in surface energy between crystal planes. From this viewpoint, in order to grow a specific crystal plane, the grain shape need not necessarily be a polyhedral shape as long as a sufficient surface energy difference is present. The piezoelectric/electrostrictive body 30 is preferably composed of an oxide represented by the general formula $ABO_3$ as a main component and preferably has a perovskite structure. Examples of such an oxide include lead titanate zirconate including a plurality of crystals mainly composed of an oxide represented by the general formula $ABO_3$ in which an A site contains Pb, and a B site contains Zr and Ti. The B site preferably further contains at least one selected from Nb, Mg, Ni, and Zn. Specific examples of such an oxide include an oxide having a $PbMg_{1/3}Nb_{2/3}O_3$—$PbZrO_3$—$PbTiO_3$ ternary solid-solution composition, an oxide having a $PbMg_{1/3}Nb_{2/3}O_3$—$PbZrO_3$—$PbTiO_3$ ternary solid-solution composition as a main component and further containing 0.05 to 3% by mass of NiO, an oxide having a $Pb(Mg, Ni)_{1/3}Nb_{2/3}O_3$—$PbZrO_3$—$PbTiO_3$ ternary solid-solution composition, and the like. Here, the term "main component" of "a $PbMg_{1/3}Nb_{2/3}O_3$—$PbZrO_3$—$PbTiO_3$ ternary solid-solution composition as a main component" represents that the content of a $PbMg_{1/3}Nb_{2/3}O_3$—$PbZrO_3$—$PbTiO_3$ ternary solid-solution composition in the whole of a piezoelectric/electrostrictive composition excluding NiO is 80% by mass or more and preferably 90% by mass or more.

Alternatively, the piezoelectric/electrostrictive body 30 may include grains mainly composed of an oxide represented by a general formula $ABO_3$ in which an A site contains at least one selected from Li, Na, K, Bi, and Ag, and a B site contains at least one selected from Nb, Ta, and Ti. In particular, $(Li_XNa_YK_Z)Nb_MTa_NO_3$ and $(Bi_XNa_YK_Z)TiO_3$ (wherein X, Y, Z, M, and N each represent an any desired numeral), and the like are more preferred. Further, the crystal grains may further contain another element. In this case, the crystal grains preferably have an A/B ratio of 1.0 or more before firing (before the firing step described below). When the A/B ratio of an oxide represented by the general formula $ABO_3$ is in the range of 1.0 or more, the aspect ration and the degree of orientation can be increased. Although examples of an oxide represented by the chemical formula $ABO_3$ are described above, other examples of a material which can be used in the present invention include oxides such as $Al_2O_3$, $ZrO_2$, $TiO_2$, MgO, CaO, $Y_2O_3$, $SnO_2$, ZnO, $SiO_2$, and the like; compound oxides such as $BaTiO_3$, $BiFeO_2$, $YBa_2Cu_3O_7$, and the like; solid solutions of perovskite compounds such as $(Bi_xNa_yK_z)TiO_3$—$BaTiO_3$, $(Bi_xNa_yK_z)TiO_3$—$KNbO_3$, and the like; nitrides such as AlN, $Si_3N_4$, BN, and the like; borides such as $CaB_6$, $MgB_2$, $LaB_6$, and the like; carbides such as TiC, SiC, WC, and the like; tellurium compounds such as $Bi_2Te_3$, $Bi_2Sb_8Te_{15}$, PbTe, and the like; silicide materials such as $CrSi_2$, $MnSi_{1.73}$, $FeSi_2$, $CoSi_2$, and the like; and other metals, alloys, intermetallic compounds, and the like.

In the piezoelectric/electrostrictive body 30, the average grain diameter of crystal grains is preferably 0.5 µm or more and more preferably 2.0 µm. When the average grain diameter is 0.5 µm or more, higher piezoelectric/electrostrictive characteristics can be obtained. In addition, the aspect ratio of the crystal grains is preferably 2 or more and more preferably 3 or more. When the aspect ratio is 2 or more, the crystal grains can be easily oriented.

Figure 2A:
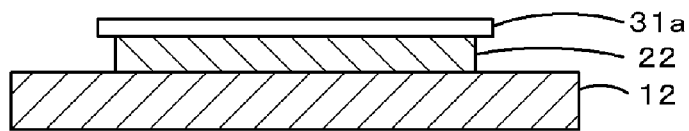
FIG. 2A is a drawing showing a step of applying a first layer.
Figure 2B:
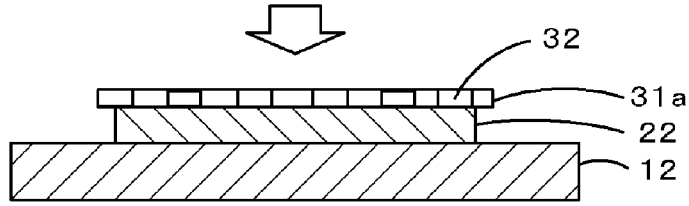
FIG. 2B is a drawing showing a step of firing the first layer.
Figure 2C:
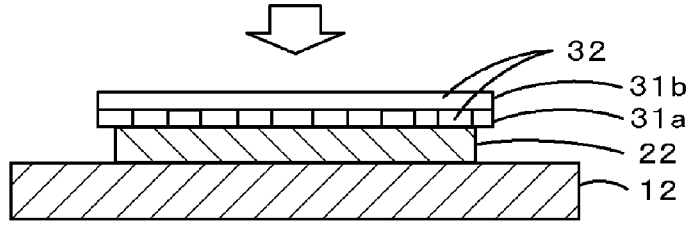
FIG. 2C is a drawing showing a step of applying a second layer.
Figure 2D:
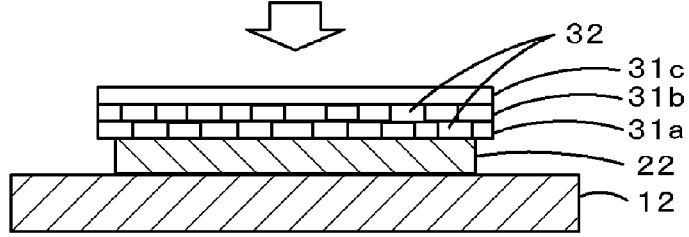
FIG. 2D is a drawing showing a step of applying a third layer after the step of firing the second layer.
Figure 2E:
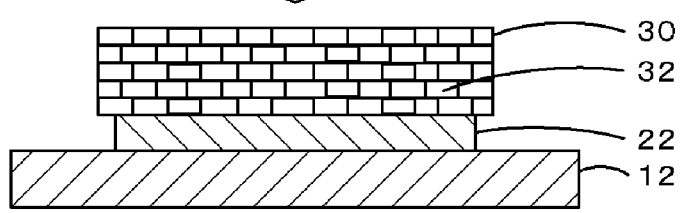
FIG. 2E is a drawing showing the completion of a piezoelectric/electrostrictive body.
Figure 2F:
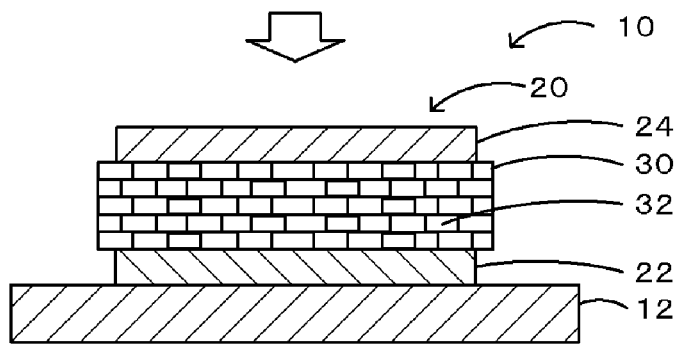
FIG. 2F shows the formation of a second electrode.

Next, a method for manufacturing the piezoelectric/electrostrictive element 20 is described. As shown in FIG. 2, the method for manufacturing the piezoelectric/electrostrictive element 20 may include (1) a first electrode forming step of forming the first electrode 22 on the fired ceramic substrate 12, (2) a first crystal forming step including a first application step of forming a first layer 31a of the piezoelectric/electrostrictive body 30 on the first electrode 22 and a first firing step of orienting and crystallizing the first layer 31a by firing, (3) a piezoelectric/electrostrictive body forming step of repeatedly laminating layers of the piezoelectric/electrostrictive body 30 to a desired thickness on the layer oriented and crystallized in the first crystal forming step, and (4) a second electrode forming step of forming the second layer 24 on the resulting piezoelectric/electrostrictive body 30. FIG. 2 is a drawing illustrating an example of the method for manufacturing a piezoelectric/electrostrictive element 20, in which FIG. 2A is a drawing showing the step of applying the first layer, FIG. 2B is a drawing showing the step of firing the first layer, FIG. 2C is a drawing showing the step of applying a second layer, FIG. 2D is a drawing showing the step of applying a third layer after the step of firing the second layer, FIG. 2E is a drawing showing the completion of the piezoelectric/electrostrictive body 30, and FIG. 2F shows the formation of the second electrode 24.

(1) First Electrode Forming Step

The fired ceramic substrate 12 on which the first electrode 22 is disposed is preferably composed of ceramic which can be fired at a temperature higher than a heat treatment temperature in a step described below and heat-treated in the step described below without being deformed or degraded. The fired ceramic substrate 12 may be an unoriented polycrystalline substrate or an oriented polycrystalline substrate, but an unoriented polycrystalline substrate is preferred. The method for manufacturing the piezoelectric/electrostrictive element 20 is capable of enhancing the degree of orientation of the piezoelectric/electrostrictive body 30 regardless of the material and orientation of a substrate which forms the piezoelectric/electrostrictive element 20, and any material which can resist the heat treatment for forming the piezoelectric/electrostrictive element 20 can be used with no problem. For example, the fired ceramic substrate 12 is preferably composed of ceramic containing at least one selected from the group consisting of zirconium oxide, aluminum oxide, magnesium oxide, mullite, aluminum nitride, and silicon nitride.

Among these, a ceramic containing zirconium oxide as a main component is more preferred, and a ceramic containing stabilized zirconium oxide as a main component is still more preferred. The fired ceramic substrate 12 is prepared by forming a desired shape and then firing it. The first electrode 22 is preferably composed of at least one metal selected from the group consisting of platinum, palladium, ruthenium, gold, silver, and alloys thereof. As the method for forming the first electrode 22, for example, a paste containing grains of the metal is prepared, applied to the fired ceramic substrate 12 by a doctor blade method or a screen printing method, and then fired. The thickness of the first electrode 22 is preferably about 0.1 µm to 20 µm depending on the thickness of the piezoelectric/electrostrictive body 30 from the viewpoint of application and suppression of displacement of the piezoelectric/electrostrictive body 30. The electrode is preferably composed of an unoriented polycrystal from the viewpoint of adhesion to the substrate and the piezoelectric/electrostrictive body. In order to form a dense electrode and an element without a hole and to enhance the degree of orientation of a piezoelectric/electrostrictive film, the electrode is preferably fired at a temperature higher than the firing temperature before firing of the piezoelectric/electrostrictive film. In this case, the flatness of an interface between the electrode and the film can be maintained high during crystal grain growth when the piezoelectric/electrostrictive film is fired, and thus grain growth in the film plane smoothly proceeds, easily improving the degree of orientation.

(2) First Crystal Forming Step

This step further includes a step of preparing inorganic particles, a first application step, and a first firing step. In the first crystal forming step, inorganic particles are formed into a film of 15 µm or less on the fired ceramic substrate 12 through the first electrode 22 and then fired to grow the crystal grains along the film plane. In this way, since the film of 15 µm or less in thickness is fired for grain growth to form a ceramic film, the grain growth in the thickness direction of the film is limited, and grain growth is more accelerated in the film plane direction. Therefore, for example, under predetermined firing conditions, crystal grains which have a large difference in grain growth rate between crystal planes and which isotropically grow, or crystal grains which have a very large difference in grain growth rate between crystal planes and which grow to isotropic and polyhedral crystal grains, for example, cubic grains, can be grown to plate-shaped crystal grains having a larger aspect ratio with specific crystal planes oriented in the film surface. In this case, in a perovskite structure oxide represented by the general formula $ABO_3$ in which an A site contains Pb, and a B site contains at least two selected from Zr, Ti, Nb, Mg, Ni, and Zn, for example, when the mixing ratio is controlled or an additive (glass or the like) is added for activating surface diffusion of the crystal grains of the oxide, grain growth is activated and the difference in grain growth rate between crystal planes is increased. When such a difference is extremely large, the crystal grains may grow to a polyhedral shape and pseudocubic cuboidal (hexahedral) grains. Grain growth in the form of a very thin film causes growth of the (100) planes within the film plane and thus facilitate the orientation of the crystal axis (100) in a direction perpendicular to the film plane. Namely, in such an oxide, grains having the (100) planes parallel to the film plane isotropically grow within the film plane because the four planes which are equivalent (100) planes other than the two planes are contained as growth planes in all directions in a shaped body, and the remaining two planes present in the film surfaces smoothly extend, thereby easily forming grains with a large aspect ratio. The aspect ratio of the crystal grains is preferably 2 or more and more preferably 3 or more. When the aspect ratio is 2 or more, the crystal grains can be easily oriented. In addition, the crystal grains preferably have a larger length in the film plane direction than that in the thickness direction. In this case, the crystal grains can be easily oriented. When crystal planes of an oxide containing Pb, Zr, and Ti are oriented, treatment can be simplified and the material cost can be decreased as compared with, for example, epitaxial growth by chemical vapor deposition on an oriented Pt electrode formed on a silicon single-crystal wafer. In addition, it is possible to suppress a decrease in purity while increasing the degree of orientation as compared with a method of preparing a piezoelectric/electrostrictive body by adding an element unnecessary for crystal orientation. The expression "without adding an unnecessary element" also includes a case in which an additive is added for enhancing the degree of orientation and mechanical strength within a range which does not significantly affect the piezoelectric/electrostrictive characteristics. Here, a growth shape under predetermined firing conditions is defined as morphology which occurs when crystals of inorganic particles reach an equilibrium under the given heat treatment conditions and is determined by observing the shape of grains in a surface when a bulk is fired to promote crystallization. As an anisotropic or polyhedral growth shape, it is preferred to select a system containing a material having a grain growth temperature close to the melting point or decomposition temperature of a solid and a low-melting-point compound such as glass added as a flux so that grain growth is performed through the flux. This is because the movement of solid constituent components in grain surfaces is activated through the flux. With respect to the aspect ratio of crystal grains, the thickness of a film is measured by SEM observation using a scanning electron microscope, a film surface is observed to calculate the area S per crystal grain by {(area of field of view)/(number of grains)} in a field of view containing about 20 to 40 crystal grains, the grain diameter is calculated by the equation (2) below on the assumption that the grains are circular grains, and the grain diameter is divided by the thickness of the film to determine the aspect ratio.

$$\text{Grain diameter} = 2\sqrt{\sqrt{S/\pi}} \quad \text{Equation (2)}$$

In the step of preparing inorganic particles, preferably, raw materials of the inorganic particles are ground and mixed, the resulting mixed powder is calcined, and the resultant inorganic particles are further ground. The inorganic particles are preferably composed of an oxide having a perovskite structure and is represented by the general formula $ABO_3$ in which an A site contains Pb, and a B site contains at least one selected from Zr, Ti, Nb Mg, Ni, and Zn. Further, 0.1 wt % or more of glass having a melting point of 1000° C. or less, such as lead borate glass, zinc borate glass, borosilicate glass, lead silicate glass, zinc-silicate glass, or bismuth-silicate glass, is added as the flux so that the growth shape easily becomes a cubic shape at 900° C. to 1300° C. In this case, from the viewpoint of dispersibility of the flux, the flux powder is not directly formed in a film, but preferably the flux powder is mixed with the inorganic particles and calcined to sufficiently disperse the flux component, and the calcined material is ground and then used in a next step. The glass component of the flux is preferred from the viewpoint of increasing crystal orientation, but the glass component is undesired from the viewpoint of durability because separation possibly occurs in a glass portion. Therefore, the glass component is not added. Alternatively, particles containing an oxide as a main component represented by the general formula $ABO_3$ wherein an A site contains at least one selected from Li, Na, K, Bi, and Ag and a B site contains at least one selected from Nb, Ta, and Ti may be used. Specifically, particles containing as a main component $(Li_XNa_YK_Z)Nb_MTa_NO_3$ and $(Bi_XNa_YK_Z)TiO_3$ (wherein X, Y, Z, M, and N each represent an any desired numeral), or the like may be used. When an oxide represented by $ABO_3$ is used, raw materials are preferably prepared so that the A/B ratio of A site to B site is 1.0 to 1.3. When the A/B ratio is in the range of 1.0 to 1.3, the aspect ratio and the degree of orientation of the crystal grains after firing can be increased. In addition, the A/B ratio in the range of 1.0 to 1.3 is preferred from the viewpoint of compensating lead and an alkali component which vaporize during firing. As the raw materials of inorganic particles, oxides, hydroxides, carbonates, sulfates, nitrates, tartrates, or the like of intended components can be used, but oxides or carbonates are mainly preferred. The inorganic particles are preferably ground to a particle size corresponding to the thickness of the film and the median diameter (D50) of the inorganic particles is preferably 2% to 60% of the thickness of the film. When the median diameter is 2% or more of the thickness of the film, grinding can be easily performed, and when the median diameter is 60% or less, the thickness of the film can be easily controlled. As the particle diameter, a value obtained by measuring a dispersion in a dispersion medium (an organic solvent or water) using a laser diffraction/scattering grain size distribution measurement device is used. The inorganic particles are preferably ground by wet grinding, for example, using a ball mill, a beads mill, a trommel, an attritor, or the like.

In the first application step, as shown in FIG. 2A, the inorganic particles are applied in a film form having a thickness of 15 µm or less on the first electrode 22. In this step, the inorganic particles can be applied on the first electrode 22 by a doctor blade method or a screen printing method using a paste containing the inorganic particles. In order to prepare the paste before application, the inorganic particles are dispersed in a proper dispersion medium, and a binder and a plasticizer may be appropriately added. In addition, the paste is preferably prepared so that the grain size is 50,000 to 500,000 cP, and degassed under reduced pressure. The thickness of the film is preferably 15 µm or less, more preferably 10 µm or less, still more preferably 5 µm or less, and most preferably 2 µm or less. When the thickness is 10 µm or less, a high degree of orientation can be achieved, and when the thickness is 5 µm or less, a higher degree of orientation can be achieved. Further, the thickness of the film is preferably 0.1 µm or more. With a film thickness of 0.1 µm or more, application can be easily performed.

In the first firing step, the inorganic particles applied in the first application step are fired at a predetermined firing temperature to grow the grains of the oriented crystals 32 with the specific crystal planes oriented in the specific direction and to fix the oriented crystals 32 to the first electrode 22. The term "fix" represents that the piezoelectric/electrostrictive body 30 is integrated directly or through the first electrode 22 by reaction with the fired ceramic substrate 12 or solid-phase reaction with the first electrode 22 without using an organic or inorganic adhesive. Preferably, the specific planes may be, for example, the pseudocubic (100) planes present in a plane of the piezoelectric/electrostrictive body, and the specific direction is, for example, a direction along the electric field direction, i.e., a direction perpendicular to the electrode planes of the first electrode 22 and the second electrode 24. With respect to the firing conditions of the first firing step, the film is preferably fired at a temperature higher by 10% or more than a firing temperature at which equilibrium crystals can be obtained by firing, for example, a firing temperature at which a bulk is densified and subjected to grain growth by firing. At a temperature higher by 10% or more, grain growth of the crystals contained in a thin film can be sufficiently promoted. Specifically, the firing temperature is higher by about 50° C. to 200° C. The inorganic particles are preferably fired at a high temperature which causes no decomposition of the material of a shaped body. In particular, the grain growth becomes difficult as the thickness of the film decreases, and thus the firing temperature is preferably further increased. For example, in the firing step for the inorganic particles composed of $Pb(Zr_{1-x}Ti_x)O_3$ as a main component in which a B site is substituted by Mg and Nb, the firing temperature of the shaped body is preferably 900° C. to 1400° C. and more preferably 1000° C. to 1350° C. When the firing temperature is 900° C. or more, growth of the crystal gains is desirably promoted, and when the firing temperature is 1400° C. or less, vaporization of the components contained can be suppressed, and the decomposition of the material can be suppressed. In the firing step for the inorganic particles composed of $(Li_X Na_YK_Z)Mb_MTa_NO_3$ in which an A site of $NaNbO_3$ is substituted by Li and K, and a B site is substituted by Ta, the firing temperature of the shaped body is preferably 900° C. to 1250° C. When the firing temperature is 900° C. or more, growth of the crystal gains is desirably promoted, and when the firing temperature is 1250° C. or less, vaporization of alkali components can be suppressed, and the decomposition of the material can be suppressed. In this way, as shown in FIG. 1B, the inorganic particles contained can be subjected to grain growth to the crystal grains 32 with the specific crystal planes oriented. When the shaped body contains a binder, heat treatment may be performed mainly for the purpose of degreasing before firing. The degreasing temperature is a temperature (e.g., 400° C. to 600° C.) sufficient to thermally decompose at least an organic material such as the binder. In addition, hydrostatic treatment (cold isostatical press (CIP)) is preferably performed before firing and after degreasing. When the film is subjected to hydrostatic treatment after degreasing, a decrease in the degree of orientation accompanying degreasing or a decrease in the sintered body density due to volume expansion of the film can be suppressed. In the first firing step, the shaped body is preferably fired under a vaporization suppressing condition in which vaporization of a specific component (for example, lead, an alkali, or the like) is suppressed. As a result, a deviation of the composition after firing can be suppressed by suppressing vaporization of the specific element from the shaped body. Examples of the vaporization suppressing condition include a condition in which other inorganic particles are allowed to coexist with the shaped body, a closed condition in which the shaped body is placed in a covered sheath or the like, and the like. In this case, it is important to experimentally determine an appropriate firing condition such as the amount of the inorganic particles allowed to coexist, the volume of the sheath, or the like. From the viewpoint of promoting in-plane grain growth, weighted firing with a hot press or the like may be performed. As described above, the film which constitutes a portion of the piezoelectric/electrostrictive body 30 containing the oriented crystals 32 oriented in the predetermined direction is formed on the first electrode 22 (FIG. 2B).

(3) Piezoelectric/Electrostrictive Body Forming Step

Figure 3:
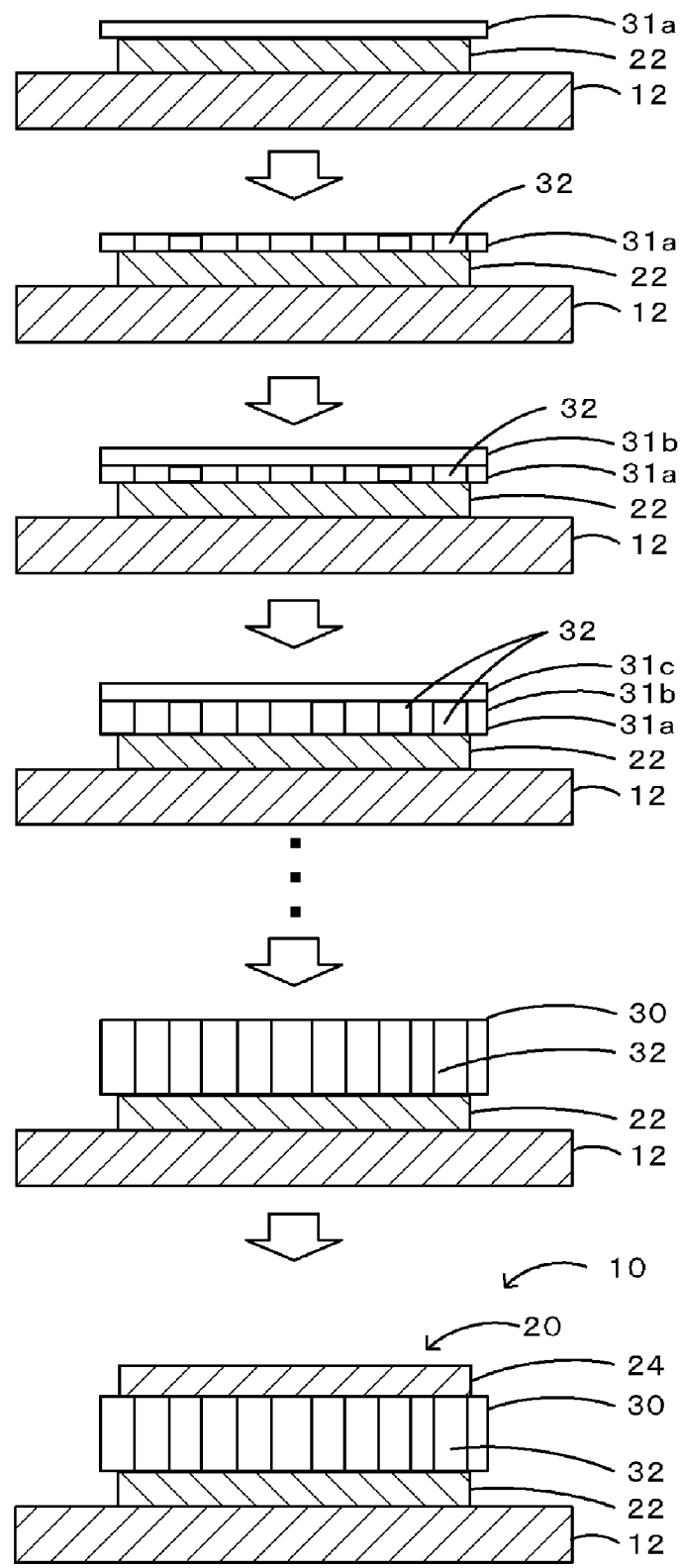
FIG. 3 is a drawing showing an example of another method for manufacturing a piezoelectric/electrostrictive element.

Next, a layer of the piezoelectric/electrostrictive body 30 is laminated to a desired thickness on the layer oriented and crystallized in the first crystal forming step. This step may include one time each of an application step of applying inorganic particles for the piezoelectric/electrostrictive body 30 on the produced crystal and a firing step of forming a crystal by firing at a predetermined temperature or several times each of an application step of applying inorganic particles for the piezoelectric/electrostrictive body 30 on the produced crystal and a firing step of forming a crystal by firing at a predetermined temperature. The number of films laminated may be appropriately set to at least one so that the piezoelectric/electrostrictive body 30 having a desired thickness, for example, 1 μm to 20 μm, is obtained. The film thickness and the firing temperature may be set to the same or different conditions as or from those in the above-described first crystal forming step. Also, as in the first crystal forming step, degreasing may be performed, hydrostatic treatment may be performed, and firing may be performed in the vaporization suppressing condition. Further, any one of these treatments may be appropriately omitted. In the piezoelectric/electrostrictive body forming step, as shown in FIG. 2, a second layer 31b containing inorganic particles is further formed on a first layer 31a containing the oriented crystals 32 (FIG. 2C) and then fired to form the second layer 31b containing oriented crystals 32. Further, a third layer 31c containing inorganic particles is further formed on the second layer 31b (FIG. 2D). These steps are repeated to obtain a desired thickness, forming the piezoelectric/electrostrictive body 30 on the first electrode 22 (FIG. 2E). Since crystals are securely grown in a film plane of each layer, the piezoelectric/electrostrictive body 30 containing the oriented crystals 32 securely oriented in the predetermined direction can be formed. In this step, the raw material for the layer (second and upper layers) formed on the layer (first layer) oriented and crystallized in the first crystal forming step may be the same as or different from that for the first layer. For example, when a material containing Pb is used for the raw material inorganic particles, a composition (for example, containing glass) which grows to isotropic and polyhedral crystal grains is used for the first layer, and the composition is subject to grain growth to a plate-like shape so that the second layer can be also subject to grain growth along the first layer. Therefore, a composition for the second layer may be different from that for the first layer. In addition, as shown in FIG. 3, the second layer 32b containing the inorganic particles is formed on the first layer 31a, and crystal orientation of the second and upper layers is performed following the orientation of the first layer 31a. In other words, the oriented crystals 32 of the first layer 31a contribute to the second and upper layers to cause crystal growth in the thickness direction.

(4) Second Electrode Forming Step

Next, a treatment is performed for forming the second electrode 24 on the formed piezoelectric/electrostrictive body 30. The first electrode 22 is formed on one of the surfaces of the piezoelectric/electrostrictive body 30, and the second electrode 24 is formed on the other surface opposite to the surface on which the first electrode 22 has been formed. The second electrode 24 can be formed under the same conditions as or different conditions from those in the above-described first electrode forming step. As a result, an actuator 10 can be manufactured, in which the piezoelectric/electrostrictive element 20 including the piezoelectric/electrostrictive body 30 which is sandwiched between the first electrode 22 and the second electrode 24 is disposed on the fired ceramic substrate 12 so that the first electrode 22 faces the fired ceramic substrate 12 (FIG. 2F).

In the piezoelectric/electrostrictive element 20 of this embodiment described in detail above, the piezoelectric/electrostrictive characteristics can be further increased by increasing the degree of orientation of the piezoelectric/electrostrictive body 30. In addition, in the piezoelectric/electrostrictive body 30, the specific crystal axis is oriented along the electric field direction, and thus the piezoelectric/electrostrictive characteristics can be further increased. Further, since the inorganic particles are formed in the film and then fired, the degree of orientation can be increased by a relatively simple method, and the piezoelectric/electrostrictive body 30 with a high degree of orientation can be prepared regardless of the orientation of the fired ceramic substrate 12. Further, since the ceramic film is formed, crystal grains which grow to an isotropic and polyhedral shape, for example, a material composed of $Pb(Zr_{1-x}Ti_x)O_3$ as a main component, can be grown to an anisotropic shape, thereby increasing crystal orientation. In addition, since ceramic films of about 15 μm can be successively laminated, the piezoelectric/electrostrictive body 30 having a thickness of 1 μm or more (for example, 20 μm) can be relatively easily prepared. Further, since crystal orientation is enhanced for each layer, the degree of orientation can be more securely increased to enhance the piezoelectric/electrostrictive characteristics.

In addition, the present invention is not limited to the above-mentioned embodiment and can be carried out in various modes within the technical scope of the present invention.

Figure 4A:
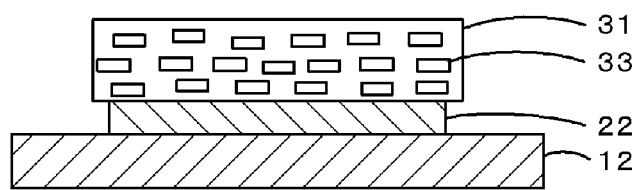
FIG. 4A is a drawing showing a step of applying a raw material of a piezoelectric/electrostrictive body.
Figure 4B:
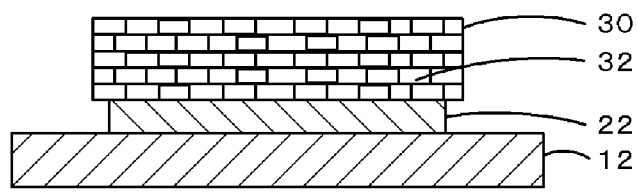
FIG. 4B is a drawing showing an oriented piezoelectric/electrostrictive body obtained after a firing step.
Figure 4C:
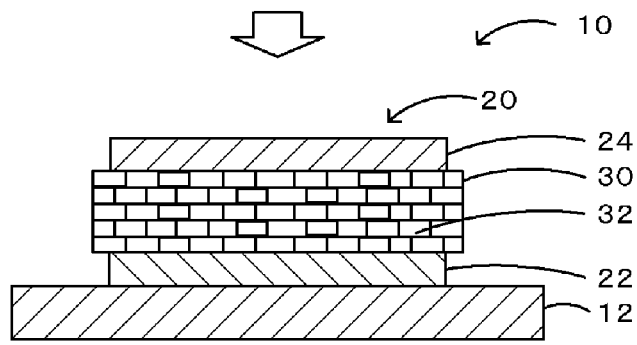
FIG. 4C is a drawing showing a step of forming a second electrode.
Figure 5:
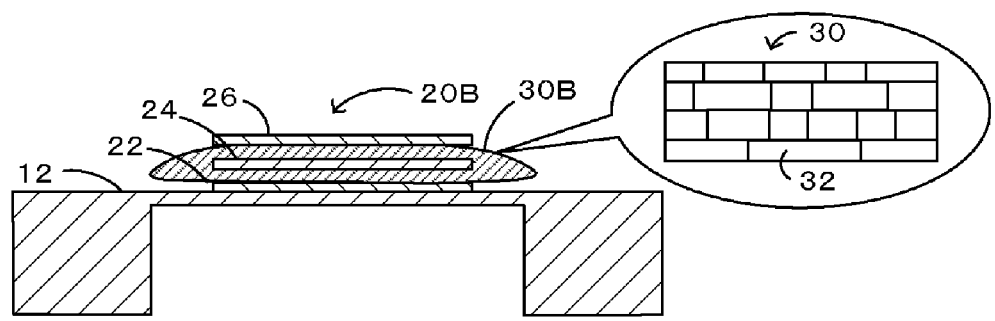
FIG. 5 is a drawing illustrating another piezoelectric/electrostrictive element.

In the above-mentioned embodiment, the treatment of applying a layer of inorganic particles and firing the layer to orient crystal planes in the predetermined direction is carried out repeatedly to prepare the piezoelectric/electrostrictive body 30. However, as shown in FIG. 5, for example, a slurry or paste containing crystal grains as a crystallized template of inorganic particles and unoriented inorganic particles may be prepared, applied once, and fired so that the crystal grains are oriented in the predetermined direction and the thickness of the piezoelectric/electrostrictive body 30 is obtained, preparing the piezoelectric/electrostrictive element 20 containing oriented crystal grains. For example, the method may include (1) a first electrode forming step, (2) a piezoelectric/electrostrictive body forming step including a application step of applying a piezoelectric/electrostrictive body raw material containing crystal grains which constitute the piezoelectric/electrostrictive body on the fired ceramic substrate directly or indirectly through the electrode, and a firing step of firing at a predetermined temperature after the application step, and (3) a second electrode forming step. FIG. 4 is a drawing illustrating an example of another method for manufacturing the piezoelectric/electrostrictive element 20, in which FIG. 4A is a drawing showing the step of applying a raw material of the piezoelectric/electrostrictive body 30, FIG. 4B is a drawing showing the oriented piezoelectric/electrostrictive body 30 obtained after a firing step, and FIG. 4C is a drawing showing the second electrode forming step. In this manufacturing method, the first electrode forming step and the second electrode forming step may be the same as those in the above-mentioned embodiment. For convenience of description, the piezoelectric/electrostrictive body forming step (2) is described in detail. In the application step of the piezoelectric/electrostrictive body forming step, crystal grains with specific crystal planes oriented in the predetermined direction are previously prepared, and a paste-shaped application raw material is prepared by mixing the crystal grains and unoriented inorganic particles. The crystal grains can be obtained by, for example, disintegrating a ceramic sheet so that the aspect ratio is not less than 2 and preferably 3, the ceramic sheet having a thickness of 15 μm or less and being formed by firing a self-supported sheet containing inorganic particles. In this case, the mechanism of orientation of the crystal planes is the same as the above-described film formed on the substrate. The term "self-supported sheet" represents a sheet obtained by firing a sheet-shaped body having a thickness of 15 μm or less and does not include a film laminated on another sheet and fired, a film bonded to some kind of substrate and fired, and a film deposited on some kind of substrate by a sputtering method, a sol-gel method, an aerosol deposition method, a printing method, or the like and supported thereon. The term "self-supported sheet" includes a film separated, before or after firing, from some kind of substrate on which the film has been bonded or deposited. As shown in FIG. 4A, the resulting crystal grains 33 are mixed with another raw material powder (e.g., unoriented inorganic particles) and proper binder and plasticizer to prepare the application raw material which is then applied to the first electrode 22 to form a film 31 in which the crystal grains 33 are oriented in the predetermined direction. The application can be performed by a screen printing method or a doctor blade method. In addition, in the application, the application raw material may be applied so that the thickness of the formed film 31 is a desired thickness required for the piezoelectric/electrostrictive body 30. Then, in the firing step, the fired ceramic substrate 12 on which the formed film 31 has been formed is fired at a predetermined temperature to orient the other inorganic particles in the orientation direction of the crystal grains 33 to prepare the piezoelectric/electrostrictive body 30 (FIG. 4B). In the firing step, the same treatment as the above embodiment may be performed under the same conditions. Then, in the second electrode forming step, the second electrode 24 is formed on the piezoelectric/electrostrictive body 30 to obtain the piezoelectric/electrostrictive element 20. In this method, the piezoelectric/electrostrictive characteristics can be enhanced by increasing the degree of orientation of the piezoelectric/electrostrictive body 30. In addition, the number of repetitions of the application step and the firing step can be changed, thereby permitting a more simple treatment. Further, the repetitions of the firing step can be reduced to decrease the quantity of energy required for orientating the crystals.

In this method, the formed film 31 containing the crystal grains 33 as the template is formed as one layer and then fired to orient the piezoelectric/electrostrictive body 30. However, a plurality of layers containing the crystal grains 33 may be formed. In this case, the piezoelectric/electrostrictive characteristics can be further enhanced by orienting the piezoelectric/electrostrictive body 30. In addition, the crystal grains are formed by preparing the self-supported ceramic sheet, for example, but the forming method is not limited to this. For example, plate-shaped crystals may be obtained from a composition having a layered perovskite structure which easily grows to an anisotropic shape (plate shape or the like) and then partially substituted in a melted salt to prepare crystal grains having a desired composition, and the resulting crystal grains may be used for manufacturing the piezoelectric/electrostrictive element 20. Although, in the above-mentioned embodiment, the crystal grains are formed by disintegrating the ceramic sheet, the ceramic sheet may be used without being disintegrated. Specifically, layers of unoriented inorganic particles and layers of ceramic sheets are alternately formed and then fired to grow the unoriented inorganic particles along the oriented crystal grains contained in the ceramic sheets. In this case, also the piezoelectric/electrostrictive characteristics can be further increased.

In the above embodiment, in the first application step of the first crystal forming step and the application step of the piezoelectric/electrostrictive body forming step, the raw material for the piezoelectric/electrostrictive body 30 is applied on the first electrode 22 and on each of the layers such as the first layer 31a. The method is not particularly limited to the application, and in the raw material forming step, the raw material for the piezoelectric/electrostrictive body 30 may be formed on any one of the fired ceramic substrate 12, the first electrode 22, and each of the layers by a sol-gel method, a chemical vapor deposition method, or a sputtering method. In this case, a dense film having a small grain size and small surface roughness can be formed. By using any one of the above-described methods, a film with excellent uniformity can be produced, even a thin film with high withstand voltage can be formed, thereby suppressing dielectric breakdown when a high electric field is applied and achieving a high displacement.

In the above embodiment, the description regards the actuator 10 including the piezoelectric/electrostrictive film element 20, however, application of the piezoelectric/electrostrictive film element of the present invention is not limited to this structure. The piezoelectric/electrostrictive film element of the present invention may be applied in various ways, utilizing its piezoelectric/electrostrictive characteristics. For example, The piezoelectric/electrostrictive film element of the present invention can be used for polycrystalline materials composed of a substance, the function or properties of which have crystallographic orientation dependence, such as dielectric materials, pyroelectric materials, piezoelectric materials, ferroelectric materials, magnetic materials, ion-conducting materials, electron-conducting materials, heat-conducting materials, thermoelectric materials, superconducting materials, and abrasion-resistant materials. Specifically, high-performance elements can be obtained by applying the piezoelectric/electrostrictive film element in various sensors, such as acceleration sensors, pyroelectric sensors, ultrasonic sensors, electric field sensors, temperature sensors, gas sensors, knocking sensors, yaw rate sensors, air bag sensors, and piezoelectric gyro sensors; energy transducers, such as piezoelectric transformers; low-loss actuators or low-loss resonators, such as piezoelectric actuators, ultrasonic motors, and resonators; and other elements, such as capacitors, bimorph piezoelectric elements, vibration pickups, piezoelectric microphones, piezoelectric ignition elements, sonars, piezoelectric buzzers, piezoelectric speakers, oscillators, filters, dielectric elements, microwave dielectric elements, thermoelectric conversion elements, pyroelectric elements, magnetoresistive elements, magnetic elements, superconducting elements, resistance elements, electron-conducting elements, ion-conducting elements, PTC elements, and NTC elements. In such cases, the thickness and the degree of orientation of the piezoelectric/electrostrictive film element may be appropriately set depending on the application.

In the above embodiment, the fired ceramic substrate 12 has a single space 14. However, the fired ceramic substrate may have a plurality of the piezoelectric/electrostrictive bodies 30 and spaces 14, or may have no space 14.

Although, in the above-described embodiment, the piezoelectric/electrostrictive body 30 has a rectangular shape, the shape is not limited to this, and any desired shape may be used. Also, this applies to the first electrode 22, the second electrode 24, and the fired ceramic substrate 12. For example, as shown in FIG. 5, a piezoelectric/electrostrictive element 20B may include a plurality of electrodes 22, 24, and 26 and a dome-shaped piezoelectric/electrostrictive body 30B, the first electrode 22 being disposed on the lower side of the piezoelectric/electrostrictive body 30B, the second electrode 24 being disposed inside the piezoelectric/electrostrictive body 30B, and the third electrode 16 being provided on the top of the piezoelectric/electrostrictive body 30B.

Although, in the above-described embodiment, the piezoelectric/electrostrictive body 30 is formed on the fired ceramic substrate 12 through the first electrode 22, the piezoelectric/electrostrictive body 30 may be formed directly on the fired ceramic substrate. In this case, also the piezoelectric/electrostrictive characteristics can be enhanced by increasing the degree of orientation of the piezoelectric/electrostrictive body.

EXAMPLES

Examples of manufacture of a piezoelectric/electrostrictive element are described as examples.

Example 1

Raw Material Preparing Step

To a synthetic powder with a composition ratio of $0.2Pb(Mg_{0.33}Nb_{0.67})O_3\text{-}0.35PbTiO_3\text{-}0.45PbZrO_3$ containing 1.5% by weight of NiO, 0.5% by weight of $ZnO\text{—}B_2O_3\text{—}SiO_2$ glass powder (manufactured by Asahi Glass Co., Ltd. (AGC), ASF1891) was added, and the resulting mixture was weighed and placed in a poly-pot together with zirconia balls and ion-exchanged water as a dispersion medium. Then, the mixture was wet-mixed by a ball mill for 16 hours. The resulting slurry was dried with a drier and then calcined at 800° C. for 2 hours. The calcined powder, zirconia balls, and ion-exchanged water as a dispersion medium were placed in a ball mill, wet-ground for 5 hours, and then dried with a drier to prepare a powder of first inorganic particles. On the other hand, synthetic powder with a composition ratio of $0.2Pb(Mg_{0.33}Nb_{0.67})O_3\text{-}0.35PbTiO_3\text{-}0.45PbZrO_3$ containing 1.5% by weight of NiO was weighed and placed in a poly-pot together with zirconia balls and ion-exchanged water as a dispersion medium. Then, the mixture was wet-mixed by a ball mill for 16 hours. The resulting slurry was dried with a drier and then calcined at 800° C. for 2 hours. The calcined powder, zirconia balls, and ion-exchanged water as a dispersion medium were placed in a ball mill, wet-ground for 5 hours, and then dried with a drier to prepare a powder of second inorganic particles.

(First Electrode Forming Step)

A first electrode (dimensions: 1.2×0.8 mm, thickness 3 μm) composed of Pt was formed on a $Y_2O_3$-stabilized $ZrO_2$ substrate having a flat thin portion (dimensions of the thin portion: 1.6×1.1 mm, thickness 7 μm) by the screen printing method and integrated with the substrate by heat treatment at 1300° C. for 2 hours.

(First Crystal Forming Step: Piezoelectric/Electrostrictive Body Forming Step)

To a composition (including the first inorganic particles) containing $0.2Pb(Mg_{0.33}Nb_{0.67})O_3\text{-}0.35PbTiO_3\text{-}0.45PbZrO_3$, 1.5% by weight of NiO, and 0.5% by weight of $ZnO\text{—}B_2O_3\text{—}SiO_2$ glass powder (manufactured by Asahi Glass Co., Ltd. (AGC) ASF1891), a dispersion medium, a plasticizer, and a dispersant were added to prepare a paste. The resulting paste was applied by the screen printing method on the formed first electrode to form a film having a size of 1.3 mm×0.9 mm and a thickness of 2 μm after drying. The resulting film was heat-treated (fired) at 1200° C. for 5 hours in a state in which the same raw materials as those of the shaped product were allowed to coexist. The thickness of the resulting ceramic film (piezoelectric/electrostrictive body) after heat treatment was 1.3 μm, and the degree of orientation according to the Lotgering method was 80%. Then, to a composition (including the second inorganic particles) containing $0.2Pb(Mg_{0.33}Nb_{0.67})O_3\text{-}0.35PbTiO_3\text{-}0.45PbZrO3$ and 1.5% by weight of NiO, a dispersion medium, a plasticizer, and a dispersant were added to prepare a paste. The resulting paste was applied on the ceramic film to form a film having a size of 1.3 mm×0.9 mm and a thickness of 8 μm after drying. The resulting film was heat-treated (fired) at 1200° C. for 5 hours. The thickness of the resulting ceramic film (piezoelectric/electrostrictive body) after heat treatment was 5.1 μm, and the degree of orientation according to the Lotgering method was 75%.
(Second Electrode Forming Step)
Next, a second electrode (dimensions: 1.2×0.8 mm, thickness 0.5 μm) composed of Au was formed on the upper surface of the piezoelectric/electrostrictive body by the screen printing method and then heat-treated to prepare a piezoelectric film-type actuator of Example 1 having a film-shaped piezoelectric drive portion.

Example 2

Raw Material Preparing Step

First and second inorganic particles were prepared by the same method as in Example 1. The first inorganic particles, a dispersion medium, a binder, a plasticizer, and a dispersant were mixed to prepare a shaping raw material slurry. Next, the resulting slurry was degassed by stirring under reduced pressure, controlled to a viscosity of 500 to 700 cP, and formed in a sheet on a PET film by the doctor blade method. The thickness after drying was 1 μm. The resulting shaped body was degreased at 600° C. for 2 hours and then fired at 1100° C. for 5 hours in a state in which the same raw materials as those of the shaped body were allowed to coexist. After firing, a portion not adhering to a setter was separated to obtain a ceramic sheet to be used for a piezoelectric/electrostrictive element. The resulting ceramic sheet was disintegrated so that the aspect ratio was not less than 3 and then classified to prepare plate-shaped polycrystalline grains having a composition containing $0.2Pb(Mg_{0.33}Nb_{0.67})O_3$-$0.35PbTiO_3$-$0.45PbZrO_3$ and 1.5% by weight of Nio.
(First Electrode Forming Step)
A first electrode composed of Pt was formed on a $Y_2O_3$-stabilized $ZrO_2$ substrate having a flat thin portion by the same method as in Example 1.
(Piezoelectric/Electrostrictive Body Forming Step)
A composition (including the second inorganic particles) containing $0.2Pb(Mg_{0.33}Nb_{0.67})O_3$-$0.35PbTiO_3$-$0.45PbZrO_3$ and 1.5% of NiO was mixed with the plate-shaped polycrystalline grains containing the first inorganic particles at a weight ratio of 80:20 to prepare a piezoelectric material. To the resulting piezoelectric material, a dispersion medium, a plasticizer, and a dispersant were added to prepare a paste. The resulting paste was applied by the screen printing method on the first electrode to form a film so that the crystal grains were oriented in one direction, the size after drying was 1.3 mm×0.9 mm, and the thickness was 8 μm. The resulting film was fired at 1150° C. for 5 hours in a state in which the same raw materials as those of the shaped body were allowed to coexist to orient the inorganic particles, thereby forming a ceramic film. The thickness of the resulting ceramic film (piezoelectric/electrostrictive body) after heat treatment was 5.1 μm, and the degree of orientation according to the Lotgering method was 50%.
(Second Electrode Forming Step)
Next, a second electrode composed of Au was formed on the upper surface of the piezoelectric/electrostrictive body by the same method as in Example 1 to prepare a piezoelectric film-type actuator of Example 2 having a film-shaped piezoelectric drive portion.

Example 3

Raw Material Preparing Step

Each of powders ($Li_2CO_3$, $Na_2CO_3$, $K_2CO_3$, $Nb_2O_5$, $Ta_2O_5$) was weighed to obtain a composition ratio of $[Li_{0.07}(Na_{0.63}K_{0.37})_{0.93}]_{1.01}Nb_{0.92}Ta_{0.08}O_3$. The weighed powders, zirconia balls, and ethanol as a dispersion medium were placed in a poly-pot, and wet-mixed and ground for 16 hours. The resulting slurry was dried and calcined at 850° C. for 5 hours. The calcined powder, zirconia balls, and ethanol as a dispersion medium were mixed, wet-ground by a ball mill for 5 hours, and then dried to prepare third inorganic particles of $[Li_{0.07}(Na_{0.63}K_{0.37})_{0.93}]_{1.0}Nb_{0.92}Ta_{0.08}O_3$.
(First Electrode Forming Step)
A first electrode composed of Pt was formed on a $Y_2O_3$-stabilized $ZrO_2$ substrate having a flat thin portion by the same method as in Example 1.
(First Crystal Forming Step: Piezoelectric/Electrostrictive Body Forming Step)
To a composition (including the third inorganic particles) containing $[Li_{0.07}(Na_{0.63}K_{0.37})_{0.93}]_{1.01}Nb_{0.92}Ta_{0.08}O_3$, a dispersion medium, a plasticizer, and a dispersant were added to prepare a paste. The resulting paste was applied by the screen printing method on the first electrode to form a film having a size of 1.3 mm×0.9 mm and a thickness of 2 μm after drying. The resulting film was heat-treated (fired) at 1100° C. for 5 hours in a state in which the same raw materials as those of the shaped body were allowed to coexist. The thickness of the resulting ceramic film (piezoelectric/electrostrictive body) after heat treatment was 1.3 μm, and the degree of orientation was 90%. Similarly, the paste containing the third inorganic particles was applied by the screen printing method on the resulting ceramic film to form a film having a size of 1.3 mm×0.9 mm and a thickness of 8 μm after drying. The resulting film was heat-treated (fired) at 1100° C. for 5 hours. The thickness of the resulting ceramic film (piezoelectric/electrostrictive body) after heat treatment was 5.0 μm, and the degree of orientation according to the Lotgering method was 85%.
(Second Electrode Forming Step)
Next, a second electrode composed of Au was formed on the piezoelectric/electrostrictive body by the same method as in Example 1 to prepare a piezoelectric film-type actuator of Example 3 having a film-shaped piezoelectric drive portion.

Example 4

Raw Material Preparing Step

Third inorganic particles were prepared by the same method as in Example 3. The third inorganic particles, a dispersion medium, a binder, a plasticizer, and a dispersant were mixed to a shaping raw material slurry. Next, the resulting slurry was degassed by stirring under reduced pressure, controlled to a viscosity of 500 to 700 cP, and formed in a sheet on a PET film by the doctor blade method. The thickness after drying was 1 μm. The resulting shaped body was degreased at 600° C. for 2 hours and then fired at 1100° C. for 5 hours in a state in which the same raw materials as those of the shaped body were allowed to coexist. After firing, a portion not welded to a setter was separated to obtain a ceramic sheet to be used for a piezoelectric/electrostrictive element. The resulting ceramic sheet was disintegrated so that the aspect ratio was not less than 3 and then classified to prepare plate-shaped polycrystalline grains having the composition $[Li_{0.07}(Na_{0.63}K_{0.37})_{0.93}]_{1.01}Nb_{0.92}Ta_{0.08}O_3$.

(First Electrode Forming Step)

A first electrode composed of Pt was formed on a $Y_2O_3$-stabilized $ZrO_2$ substrate having a flat thin portion by the same method as in Example 1.

(Piezoelectric/Electrostrictive Body Forming Step)

An inorganic particle powder (unoriented raw material powder) having a composition [$Li_{0.07}$ ($Na_{0.63}K_{0.37}$)$_{0.93}$]$_{1.01}$$Nb_{0.92}Ta_{0.08}O_3$ after firing was mixed with plate-shaped polycrystalline grains containing the third inorganic particles in an amount of 30 parts by weight relative to 100 parts by weight of the inorganic material. To the resulting mixture, a dispersion medium, a plasticizer, and a dispersant were added to the mixture, preparing a paste. The resulting paste was applied by the screen printing method on the first electrode to form a film so that the size after drying was 1.3 mm×0.9 mm, and the thickness was 8 μm. The resulting film was dried at room temperature, degreased at 600° C. for 2 hours, and then fired at 1100° C. for 5 hours in a state in which the same raw materials as those of the shaped body were allowed to coexist to grow the inorganic particles, thereby forming a ceramic film. The thickness of the resulting ceramic film (piezoelectric/electrostrictive body) after heat treatment was 5.1 μm, and the degree of orientation according to the Lotgering method was 70%.

(Second Electrode Forming Step)

Next, a second electrode composed of Au was formed on the upper surface of the piezoelectric/electrostrictive body by the same method as in Example 1 to prepare a piezoelectric film-type actuator of Example 4 having a film-shaped piezoelectric drive portion.

Example 5

A piezoelectric film-type actuator of Example 5 was formed by the same steps as in Example 2 except that the piezoelectric/electrostrictive body forming step was carried out using as a raw material powder only inorganic particles (unoriented second inorganic particles) having a composition $0.2Pb(Mg_{0.33}Nb_{0.67})O_3$-$0.35PbTiO3$-$0.45PbZrO_3$ containing 1.5% by weight of NiO without using plate-shaped polycrystalline grains.

Example 6

A piezoelectric film-type actuator of Example 6 was formed by the same steps as in Example 4 except that the piezoelectric/electrostrictive body forming step was carried out using as a raw material powder only inorganic particles (unoriented third inorganic particles) having the composition [$Li_{0.07}$ ($Na_{0.63}K_{0.37}$)$_{0.93}$]$_{1.01}$$Nb_{0.92}Ta_{0.08}O_3$ of a piezoelectric/electrostrictive body after firing without using plate-shaped polycrystalline grains.

Example 7

Raw Material Preparing Step

A synthetic powder with a composition ratio of $0.2Pb(Mg_{0.33}Nb_{0.67})O_3$-$0.35PbTiO_3$-$0.45PbZrO_3$ containing 0.5% by weight NiO and 1.0% by weight of MgO was weighed and placed in a poly-pot together with zirconia balls and ion-exchanged water as a dispersion medium. Then, the mixture was wet-mixed by a ball mill for 16 hours. The resulting slurry was dried with a drier and then calcined at 800° C. for 2 hours. The calcined powder, zirconia balls, and ion-exchanged water as a dispersion medium were placed in a ball mill, wet-ground for 5 hours, and then dried with a drier to prepare a powder of first inorganic particles. On the other hand, a synthetic powder with a composition ratio of $0.2Pb(Mg_{0.33}Nb_{0.67})O_3$-$0.35PbTiO_3$-$0.45PbZrO_3$ containing 0.5% by weight of Nio was weighed and placed in a poly-pot together with zirconia balls and ion-exchanged water as a dispersion medium. Then, the mixture was wet-mixed by a ball mill for 16 hours. The resulting slurry was dried with a drier and then calcined at 800° C. for 2 hours. The calcined powder, zirconia balls, and ion-exchanged water as a dispersion medium were placed in a ball mill, wet-ground for 5 hours, and then dried with a drier to prepare a powder of second inorganic particles. As a result of measurement of the average grain size of the powder using water as a dispersion medium and HORIBA laser diffraction/scattering grain size distribution measuring apparatus LA-750, the median diameter (D50) was 0.4 μm.

(First Electrode Forming Step)

A first electrode (dimensions: 1.2×0.8 mm, thickness 3 μm) composed of Pt was formed on a $Y_2O_3$-stabilized $ZrO_2$ substrate having a flat thin portion (dimensions of the thin portion: 1.6×1.1 mm, thickness 7 μm) by the screen printing method and integrated with the substrate by heat treatment at 1300° C. for 2 hours.

(First Crystal Forming Step: Piezoelectric/Electrostrictive Body Forming Step)

To a composition (including the first inorganic particles) containing $0.2Pb(Mg_{0.33}Nb_{0.67})O_3$-$0.35PbTiO_3$-$0.45PbZrO_3$, 0.5% by weight of NiO, and 1.0% by weight of MgO, a dispersion medium, a plasticizer and a dispersant were added to prepare a paste. The resulting paste was applied by the screen printing method on the formed first electrode to form a film having a size of 1.3 mm×0.9 mm and a thickness of 2 μm after drying. The resulting film was heat-treated (fired) at 1280° C. for 3 hours in a state in which 20 g of a powder with a composition containing $0.12Pb(Mg_{0.33}Nb_{0.67})O_3$-$0.38PbTiO_3$-$0.50PbZrO_3$ and 0.5% by weight of NiO was allowed to coexist in a sheath (dimensions: 90 mm square, height 50 mm) made of magnesia. The thickness of the resulting ceramic film (piezoelectric/electrostrictive body) after heat treatment was 1.3 μm, and the degree of orientation according to the Lotgering method was 80%. On the other hand, to a composition (including the second inorganic particles) containing $0.2Pb(Mg_{0.33}Nb_{0.67})O_3$-$0.35PbTiO_3$-$0.45PbZrO_3$ and 0.5% by weight of NiO, a dispersion medium, a plasticizer, and a dispersant were added to prepare a paste. The resulting paste was applied on the ceramic film to form a film having a size of 1.3 mm×0.9 mm and a thickness of 8 μm after drying. The resulting film was heat-treated (fired) at 1280° C. for 3 hours in a state in which 20 g of a powder with a composition containing $0.12Pb(Mg_{0.33}Nb_{0.67})O_3$-$0.38PbTiO_3$-$0.50PbZrO_3$ and 0.5% by weight of Nio was allowed to coexist in a sheath. The thickness of the resulting ceramic film (piezoelectric/electrostrictive body) after heat treatment was 5.1 μm, and the degree of orientation according to the Lotgering method was 73%.

Example 8

Raw Material Preparing Step

A synthetic powder with a composition ratio of $0.2Pb(Mg_{0.33}Nb_{0.67})O_3$-$0.43PbTiO_3$-$0.37PbZrO_3$ containing 0.5% by weight of NiO and 1.0% by weight of MgO was weighed and placed in a poly-pot together with zirconia balls and ion-exchanged water as a dispersion medium. Then, the mixture was wet-mixed by a ball mill for 16 hours. The resulting slurry was dried with a drier and then calcined at 800° C. for 2 hours. The calcined powder, zirconia balls, and ion-exchanged water as a dispersion medium were placed in a ball mill, wet-ground for 5 hours, and then dried with a drier to prepare a powder of first inorganic particles. On the other hand, a synthetic powder with a composition ratio of 0.2Pb$(Mg_{0.33}Nb_{0.67})O_3$-0.43$PbTiO_3$-0.37$PbZrO_3$ containing 0.5% by weight of NiO was weighed and placed in a poly-pot together with zirconia balls and ion-exchanged water as a dispersion medium. Then, the mixture was wet-mixed by a ball mill for 16 hours. The resulting slurry was dried with a drier and then calcined at 800° C. for 2 hours. The calcined powder, zirconia balls, and ion-exchanged water as a dispersion medium were placed in a ball mill, wet-ground for 5 hours, and then dried with a drier to prepare a powder of second inorganic particles. As a result of measurement of the average grain size of the powder using water as a dispersion medium and HORIBA laser diffraction/scattering grain size distribution measuring apparatus LA-750, the median diameter (D50) was 0.4 μm.

(First Electrode Forming Step)

A first electrode (dimensions: 1.2×0.8 mm, thickness 3 μm) composed of Pt was formed on a $Y_2O_3$-stabilized $ZrO_2$ substrate having a flat thin portion (dimensions of the thin portion: 1.6×1.1 mm, thickness 7 μm) by the screen printing method and integrated with the substrate by heat treatment at 1300° C. for 2 hours.

(First Crystal Forming Step: Piezoelectric/Electrostrictive Body Forming Step)

To a composition (including the first inorganic particles) containing 0.20Pb$(Mg_{0.33}Nb_{0.67})O_3$-0.43$PbTiO_3$-0.37$PbZrO_3$, 0.5% by weight of NiO, and 1.0% by weight of MgO, a dispersion medium, a plasticizer and a dispersant were added to prepare a paste. The resulting paste was applied by the screen printing method on the formed first electrode to form a film having a size of 1.3 mm×0.9 mm and a thickness of 2 μm after drying. The resulting film was heat-treated (fired) at 1280° C. for 3 hours in a state in which 20 g of a powder with a composition containing 0.12Pb$(Mg_{0.33}Nb_{0.67})O_3$-0.43$PbTiO_3$-0.45$PbZrO_3$ and 0.5% by weight of NiO was allowed to coexist in a sheath (dimensions: 90 mm square, height 50 mm) made of magnesia. The thickness of the resulting ceramic film (piezoelectric/electrostrictive body) after heat treatment was 1.3 μm, and the degree of orientation according to the Lotgering method was 83%. On the other hand, to a composition (including the second inorganic particles) containing 0.2Pb$(Mg_{0.33}Nb_{0.67})O_3$-0.35$PbTiO_3$-0.45$PbZrO_3$ and 0.5% by weight of NiO, a dispersion medium, a plasticizer, and a dispersant were added to prepare a paste. The resulting paste was applied on the ceramic film to form a film having a size of 1.3 mm×0.9 mm and a thickness of 8 μm after drying. The resulting film was heat-treated (fired) at 1280° C. for 3 hours in a state in which 20 g of a powder with a composition containing 0.12Pb$(Mg_{0.33}Nb_{0.67})O_3$-0.43$PbTiO_3$-0.45$PbZrO_3$ and 0.5% by weight of NiO was allowed to coexist in a sheath. The thickness of the resulting ceramic film (piezoelectric/electrostrictive body) after heat treatment was 5.1 μm, and the degree of orientation according to the Lotgering method was 77%.

Example 9

Raw Material Preparing Step

Each of powders ($Bi_2O_3$, $Na_2CO_3$, $K_2CO_3$, $TiO_2$) was weighed to obtain a composition ratio of $(Bi_{0.5}Na_{0.45}K_{0.05})_{1.2}TiO_{3.2}$. The weighed powders, zirconia balls, and ethanol as a dispersion medium were placed in a poly-pot, and wet-mixed and ground for 16 hours with a ball mill. The resulting slurry was dried and calcined at 800° C. for 2 hours. The calcined powder, zirconia balls, and ethanol as a dispersion medium were mixed, wet-ground by a ball mill for 5 hours, and then dried to prepare fourth inorganic particles of $(Bi_{0.5}Na_{0.45}K_{0.05})_{1.2}TiO_{3.2}$. As a result of measurement of the average grain size of the powder using water as a dispersion medium and HORIBA laser diffraction/scattering grain size distribution measurement apparatus LA-750, the median diameter (D50) was 0.4 μm.

(First Electrode Forming Step)

A first electrode composed of Pt was formed on a $Y_2O_3$-stabilized $ZrO_2$ substrate having a flat thin portion by the same method as in Example 1.

(First Crystal Forming Step: Piezoelectric/Electrostrictive Body Forming Step)

To a composition (fourth inorganic particles) containing $(Bi_{0.5}Na_{0.45}K_{0.05})_{1.2}TiO_{3.2}$, a dispersion medium, a plasticizer, and a dispersant were added to prepare a paste. The resulting paste was applied by the screen printing method on the first electrode to form a film having a size of 1.3 mm×0.9 mm and a thickness of 2 μm after drying. The resulting film was heat-treated (fired) at 1200° C. for 5 hours in a state in which the same raw materials as those of the shaped body were allowed to coexist. The thickness of the resulting ceramic film (piezoelectric/electrostrictive body) after heat treatment was 1.3 μm, and the degree of orientation was 70%. Similarly, the paste containing the fourth inorganic particles was applied by the screen printing method on the resulting ceramic film to form a film having a size of 1.3 mm×0.9 mm and a thickness of 8 μm after drying. The resulting film was heat-treated (fired) at 1100° C. for 5 hours. The thickness of the resulting ceramic film (piezoelectric/electrostrictive body) after heat treatment was 5.0 μm, and the degree of orientation according to the Lotgering method was 60%.

(Second Electrode Forming Step)

Next, a second electrode composed of Au was formed on the piezoelectric/electrostrictive body by the same method as in Example 1 to prepare a piezoelectric film-type actuator of Example 9 having a film-shaped piezoelectric drive portion.

Example 10

A piezoelectric film-type actuator of Example 10 was formed by the same steps as in Example 9 except that the piezoelectric/electrostrictive body forming step was carried out using as a raw material powder only inorganic particles having the composition $(Bi_{0.5}Na_{0.45}K_{0.05})TiO_3$ of a piezoelectric/electrostrictive body without using plate-shaped polycrystalline grains, and firing was performed at 1200° C. for 5 hours.

[X-Ray Diffraction Measurement, Calculation of Degree of Orientation]

For Examples 1 to 10, a crystal plane of a ceramic film (piezoelectric/electrostrictive body) was irradiated with X-rays using an XRD diffraction apparatus (manufactured by Rigaku Corporation, RINT TTRIII) to measure an XRD diffraction pattern. On the basis of the measurement results, the degree of orientation of a pseudocubic (100) plane was calculated by the above-described equation (1) using pseudocubic (100), (110), and (111) peaks according to the Lotgering method. For Examples 1 and 3, the first layer which was formed in a film form on the first electrode and subject to grain growth in the first crystal forming step was also measured with respect to an XRD diffraction pattern (refer to FIGS. 6 and 8).

[Electron Microscope Photography]

Figure 7:
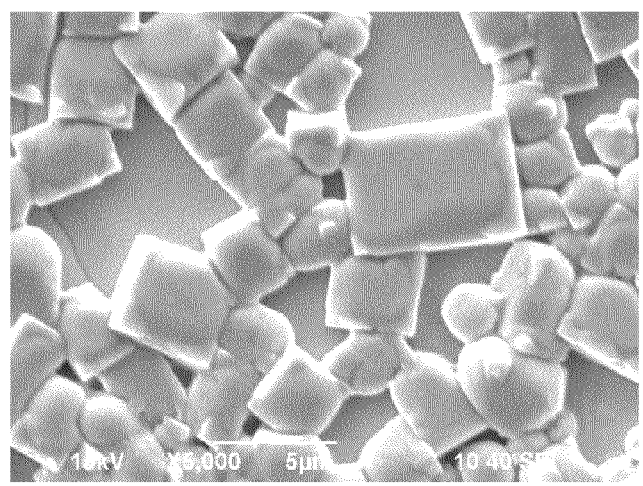
FIG. 7 is a SEM photograph of Example 1.
Figure 9:
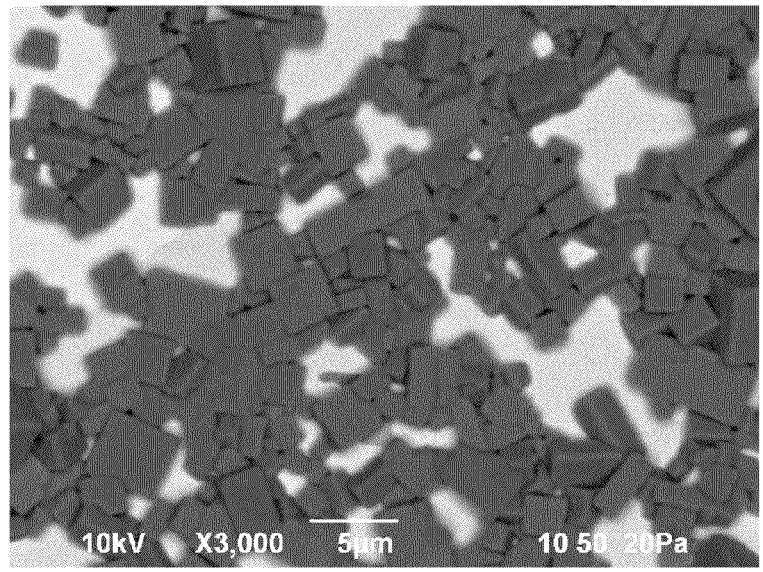
FIG. 9 is a SEM photograph of Example 3.
Figure 10:
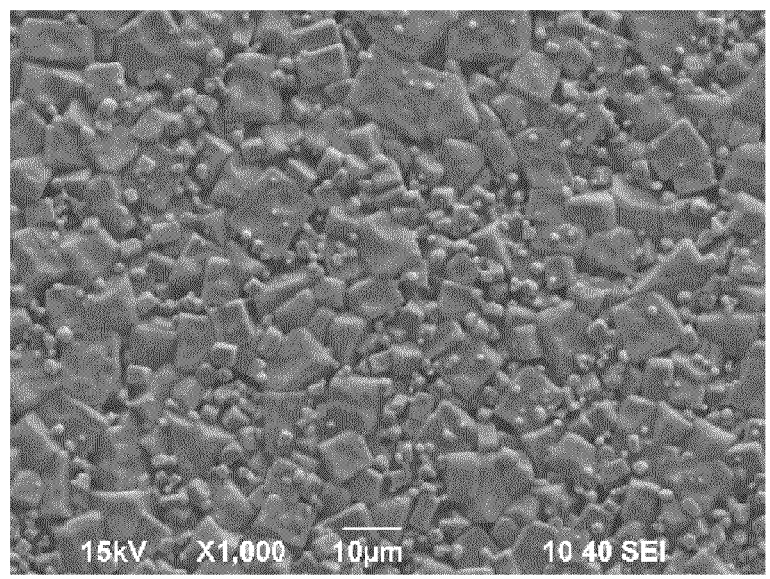
FIG. 10 is a SEM photograph of a second layer of Example 3.

For Examples 1 and 3, the first layer which was formed in a film form on the first electrode and subjected to grain growth in the first crystal forming step was measured by SEM photography using a scanning electron microscope (manufactured by JEOL, Ltd., JSM-6390) (refer to FIGS. 7 and 9). Also, a SEM photograph of a second layer in Example 3 is shown in FIG. 10.

[Flexural Displacement]

A voltage was applied between the electrodes of each of the piezoelectric/electrostrictive film-type actuators 10 of Examples 1 to 10 so that an electric field was 3 kV/mm. The produced flexural displacement (μm) was measured with a laser Doppler vibrometer (manufactured by Graphtec Co., Ltd., sensor AT0022, modulator AT3500).

[Measurement Result]

Figure 6:
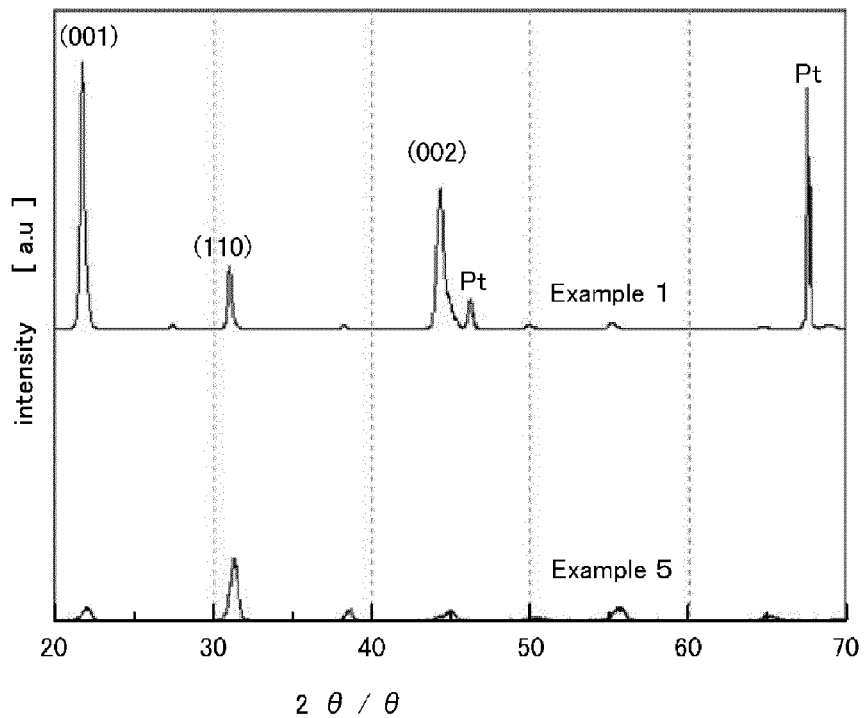
FIG. 6 is a graph showing the results of X-ray diffraction measurement in Example 1 and Example 5.
Figure 8:
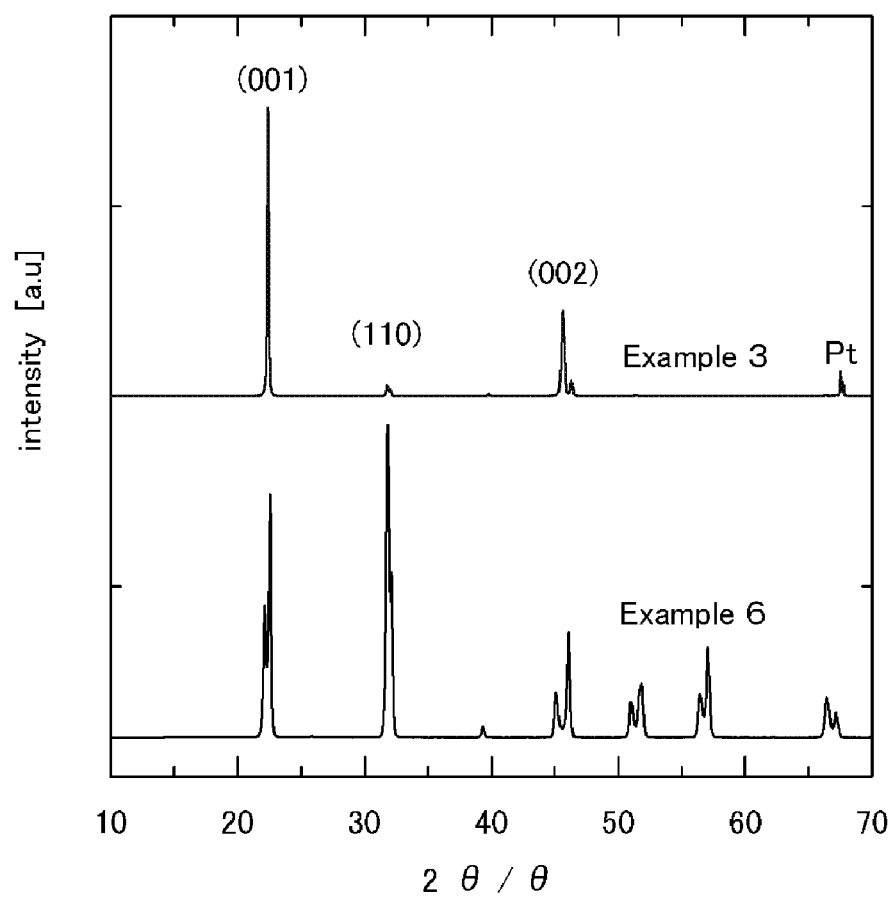
FIG. 8 is a graph showing the results of X-ray diffraction measurement in Example 3 and Example 6.

The measurement results are shown in Table 1. FIG. 6 shows that with a composition containing Pb, Zr, and Ti, the degree of orientation in Example 1 is higher than that in Example 5. Also, FIG. 7 shows that in Example 1, grains in the first layer of the piezoelectric/electrostrictive body on the first electrode are grown to a plate shape having a high aspect ratio. Further, FIG. 8 shows that with a composition containing Na and Nb in Example 3, the piezoelectric/electrostrictive body is composed of one phase as compared with Example 6. Also, FIG. 9 shows that in Example 3, grains in the first layer of the piezoelectric/electrostrictive body on the first electrode are grown to a plate shape having a high aspect ratio. It is also found that in Examples 1 to 4, the degree of orientation according to the Lotgering method is as high as 50% or more, the value of flexural displacement is higher than those of Examples 5 and 6, and high piezoelectric/electrostrictive characteristics are exhibited. It is further found that in Examples 7 and 8, higher orientation and flexural displacement can be obtained without the addition of a glass component. Therefore, it is supposed that in Examples 7 and 8, deterioration of the piezoelectric characteristics is suppressed because a glass component is not added, while when a glass component is added, the piezoelectric characteristics may be degraded due to separation of a glass portion present in the element. Table 1 shows that with a composition containing Bi and Ti, the degree of orientation according to the Lotgering method in Example 9 is as high as 50% or more, and the value of flexural displacement is also higher than that in Example 10, and thus high piezoelectric/electrostrictive characteristics are exhibited. It is also found that in Examples 1 to and 7 to 9, the degree of orientation of the piezoelectric/electrostrictive body can be enhanced regardless of the orientation of the fired ceramic substrate.

TABLE 1

| Sample | Composition | Degree of orientation[1] (%) | Flexural displacement (μm) |
|---|---|---|---|
| Example 1 | Basic composition: Lead 1[2] | 75 | 3.08 |
| Example 2 | Basic composition: Lead 1[2] | 50 | 2.85 |
| Example 3 | Basic composition: Niobium 1[3] | 85 | 1.90 |
| Example 4 | Basic composition: Niobium 1[3] | 70 | 1.75 |
| Example 5 | Basic composition: Lead 1[2] | 0 | 2.33 |
| Example 6 | Basic composition: Niobium 1[3] | 0 | 1.22 |
| Example 7 | Basic composition: Lead 2[4] | 73 | 3.25 |
| Example 8 | Basic composition: Lead 3[5] | 77 | 3.28 |
| Example 9 | Basic composition: Bismuth 1[6] | 60 | 1.09 |
| Example 10 | Basic composition: Bismuth 2[7] | 0 | 0.81 |

[1]Degree of orientation of the (100) plane measured according to the Lotgering method
[2]Lead 1: $0.2Pb(Mg_{0.33}Nb_{0.67})O_3 - 0.35PbTiO_3 - 0.45PbZrO_3 + 1.5$ wt % NiO
[3]Niobium 1: $\{Li_{0.07}(Na_{0.63}K_{0.37})_{0.93}\}_{1.01}Nb_{0.92}Ta_{0.08}O_3$
[4]Lead 2: $0.2Pb(Mg_{0.33}Nb_{0.67})O_3 - 0.35PbTiO_3 - 0.45PbZrO_3 + 0.5$ wt % NiO + 1.0 wt % MgO
[5]Lead 3: $0.2Pb(Mg_{0.33}Nb_{0.67})O_3 - 0.43PbTiO_3 - 0.37PbZrO_3 + 0.5$ wt % NiO + 1.0 wt % MgO
[6]Bismuth 1: $(Bi_{0.5}Na_{0.45}K_{0.05})_{1.2}TiO_{3.2}$
[7]Bismuth 2: $(Bi_{0.5}Na_{0.45}K_{0.05})TiO_3$ The present application claims priority from each of the Japanese Patent Application No. 2008-019717 filed on Jan. 30, 2008, the Japanese Patent Application No. 2008-152100 filed on Jun. 10, 2008, the Japanese Patent Application No. 2008-074427 filed on Mar. 21, 2008, the Japanese Patent Application No. 2008-152099 filed on Jun. 10, 2008 and the Japanese Patent Application No. 2008-303236 filed on Nov. 27, 2008, the entire contents of all of which are incorporated herein by reference.

What is claimed is:

1. A piezoelectric/electrostrictive film element comprising:
    a fired ceramic substrate;
    an electrode; and
    a piezoelectric/electrostrictive body formed on the fired ceramic substrate directly or indirectly through the electrode and oriented in a specific direction without containing a glass component,
    wherein the piezoelectric/electrostrictive body has a degree of orientation of 25% or more according to the Lotgering method.

2. The piezoelectric/electrostrictive film element according to claim 1, wherein the piezoelectric/electrostrictive body is formed in a thickness of 1 μm to 20 μm.

3. The piezoelectric/electrostrictive film element according to claim 1, wherein the piezoelectric/electrostrictive body includes crystal grains having an aspect ratio of 2 or more, which is a ratio of the grain diameter in the in-plane direction to that in the thickness direction.

4. The piezoelectric/electrostrictive film element according to claim 1, wherein the piezoelectric/electrostrictive body includes a plurality of crystals mainly composed of an oxide represented by a general formula $ABO_3$ in which an A site contains Pb, and a B site contains at least one selected from Zr, Ti, Nb, Mg, Ni, and Zn.

5. The piezoelectric/electrostrictive film element according to claim 1, wherein the piezoelectric/electrostrictive body includes a plurality of crystals mainly composed of an oxide represented by a general formula $ABO_3$ in which an A site contains at least one selected from Li, Na, K, Bi, and Ag, and a B site contains at least one selected from Nb, Ta, and Ti.

6. The piezoelectric/electrostrictive film element according to claim 1, wherein the piezoelectric/electrostrictive body is oriented along the direction of an electric field.

7. The piezoelectric/electrostrictive film element according to claim 1, wherein the electrode is composed of an unoriented polycrystalline metal.

8. The piezoelectric/electrostrictive film element according to claim 1, wherein the fired ceramic substrate is composed of an unoriented polycrystalline base material.

9. The piezoelectric/electrostrictive film element according to claim 1, wherein the fired ceramic substrate is composed of zirconia as a main component.

10. A method for manufacturing a piezoelectric/electrostrictive film element comprising providing a piezoelectric/electrostrictive film element including:
    a fired ceramic substrate;
    an electrode; and
    a piezoelectric/electrostrictive body formed on the fired ceramic substrate directly or indirectly through the electrode and oriented in a specific direction without containing a glass component,
    wherein the piezoelectric/electrostrictive body has a degree of orientation of 25% or more according to the Lotgering method, the method including:
    a raw material forming step of forming a piezoelectric/electrostrictive body raw material containing crystal grains and not containing a glass component on the fired ceramic substrate directly or indirectly through the electrode; and
    a firing step of firing the raw material at a predetermined temperature to form a crystal.

11. The method according to claim 10, wherein the piezoelectric/electrostrictive body raw material is formed so that a piezoelectric/electrostrictive body has a thickness of 1 μm to 20 μm.

12. The method according to claim 10, wherein the piezoelectric/electrostrictive body raw material is formed to become an oxide represented by a general formula $ABO_3$ in which an A site contains Pb, and a B site contains at least one selected from Zr, Ti, Nb, Mg, Ni, and Zn.

13. The method according to claim 10, wherein the piezoelectric/electrostrictive body raw material is formed to become an oxide represented by a general formula $ABO_3$ in which an A site contains at least one selected from Li, Na, K, Bi, and Ag, and a B site contains at least one selected from Nb, Ta, and Ti.

14. The method according to claim 10, wherein the raw material is fired to be a piezoelectric/electrostrictive body oriented along the direction of an electric field.

15. The method according to claim 10, wherein the electrode is composed of an unoriented polycrystalline metal.

16. The method according to claim 10, wherein the fired ceramic substrate is composed of an unoriented polycrystalline base material.

17. The method according to claim 10, wherein the raw material forming step is an application step of applying a raw material which is to be a piezoelectric/electrostrictive body.

18. A method for manufacturing a piezoelectric/electrostrictive film element comprising:
    providing a piezoelectric/electrostrictive film element including:
    a fired ceramic substrate;
    an electrode; and
    a piezoelectric/electrostrictive body formed on the fired ceramic substrate directly or indirectly through the electrode and oriented in a specific direction without containing a glass component,
    wherein the piezoelectric/electrostrictive body has a degree of orientation of 25% or more according to the Lotgering method, the method including:
    a first crystal forming step including a raw material forming step of forming a piezoelectric/electrostrictive body raw material not containing a glass component on the fired ceramic substrate directly or indirectly through the electrode, and a firing step of firing the raw material at a predetermined temperature to form a crystal; and
    a piezoelectric/electrostrictive body forming step of performing at least one time a raw material forming step of forming a piezoelectric/electrostrictive body raw material not containing a glass component on the resulting crystal, and a firing step of firing the raw material at a predetermined temperature to form a crystal.

19. The method according to claim 18, wherein in the raw material forming step, the raw material is formed in a thickness of 5 μm or less.

* * * * *